United States Patent
Suda et al.

(10) Patent No.: US 9,666,494 B2
(45) Date of Patent: May 30, 2017

(54) METHOD OF MANUFACTURING SEMICONDUCTOR DEVICE

(71) Applicant: HITACHI KOKUSAI ELECTRIC INC., Tokyo (JP)

(72) Inventors: Atsuhiko Suda, Toyama (JP); Kazuyuki Toyoda, Toyama (JP); Toshiyuki Kikuchi, Toyama (JP)

(73) Assignee: Hitachi Kokusai Electric, Inc., Tokyo (JP)

( * ) Notice: Subject to any disclaimer, the term of this patent is extended or adjusted under 35 U.S.C. 154(b) by 0 days.

(21) Appl. No.: 14/975,987

(22) Filed: Dec. 21, 2015

(65) Prior Publication Data

US 2016/0293498 A1 Oct. 6, 2016

(30) Foreign Application Priority Data

Mar. 31, 2015 (JP) ................. 2015-071085

(51) Int. Cl.
| | |
|---|---|
| H01L 21/66 | (2006.01) |
| H01L 21/321 | (2006.01) |
| H01L 21/3213 | (2006.01) |
| C23C 16/24 | (2006.01) |
| C23C 16/56 | (2006.01) |

(52) U.S. Cl.
CPC ............. *H01L 22/12* (2013.01); *C23C 16/24* (2013.01); *C23C 16/56* (2013.01); *H01L 21/3212* (2013.01); *H01L 21/32139* (2013.01)

(58) Field of Classification Search
CPC .............. H01L 22/12; H01L 21/3212; H01L 21/32139; C23C 16/56; C23C 16/24
See application file for complete search history.

(56) References Cited

U.S. PATENT DOCUMENTS

| 2001/0053423 A1 | 12/2001 | Li et al. |
| 2012/0103801 A1* | 5/2012 | Kodaira ............... C23C 14/35 |
| | | 204/298.08 |

FOREIGN PATENT DOCUMENTS

| JP | 2013055165 A | 3/2013 |
| KR | 100922487 B1 | 10/2009 |

OTHER PUBLICATIONS

Korean Office Action dated Jun. 17, 2016 for Appln. No. 10-2015-0182633.
Korean Decision of Rejection for Korean Patent Application No. 10-2015-0182633 dated Oct. 11, 2016 (with English translation).

* cited by examiner

*Primary Examiner* — Kyoung Lee
(74) *Attorney, Agent, or Firm* — Volpe and Koenig, P.C.

(57) ABSTRACT

The present disclosure provides a technique capable of suppressing a deviation in a characteristic of a semiconductor device. There is provided a technique includes: (a) receiving data representing a thickness distribution of a polished silicon-containing layer on a substrate comprising a convex structure whereon the polished silicon-containing layer is formed; (b) calculating, based on the data, a process data for reducing a difference between a thickness of a portion of the polished silicon-containing layer formed at a center portion of the substrate and that of the polished silicon-containing layer formed at a peripheral portion of the substrate; (c) loading the substrate into a process chamber; (d) supplying a process gas to the substrate; and (e) compensating for the difference based on the process data by activating the process gas with a magnetic field having a predetermined strength on the substrate.

16 Claims, 26 Drawing Sheets

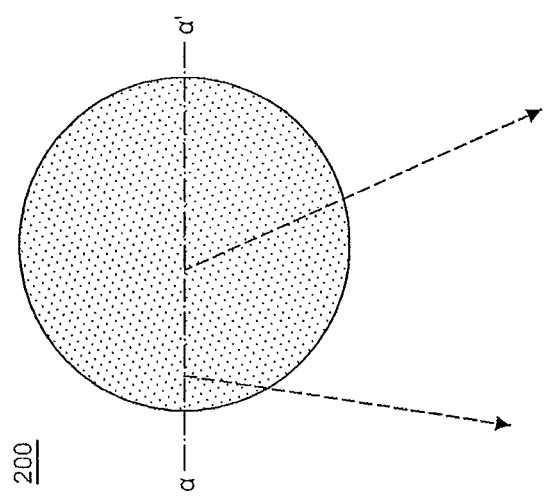
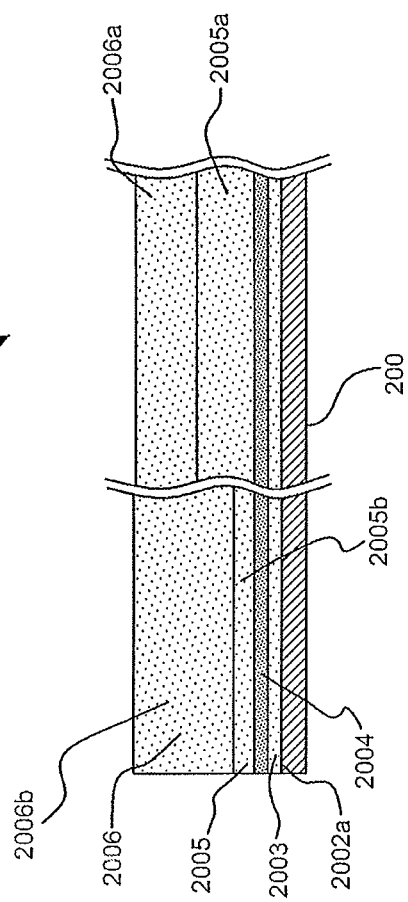
FIG. 8A
FIG. 8B

METHOD OF MANUFACTURING SEMICONDUCTOR DEVICE

CROSS-REFERENCE TO RELATED PATENT APPLICATION

This non-provisional U.S. patent application claims priority under 35 U.S.C. §119 of Japanese Patent Application No. 2015-071085, filed on Mar. 31, 2015, the entire contents of which are hereby incorporated by reference.

BACKGROUND OF THE INVENTION

1. Field of the Invention

The present invention relates to a method of manufacturing a semiconductor device, a substrate processing apparatus and a non-transitory computer-readable recording medium.

2. Description of the Related Art

Recently, semiconductor devices are becoming highly integrated. Thus, sizes of patterns are being significantly miniaturized. The patterns are formed through a hard mask or resist forming process, a lithography process, an etching process and the like. In forming the patterns, it is required that a deviation of the characteristics of semiconductor device does not occur.

SUMMARY OF THE INVENTION

Also, due to manufacturing problems, a deviation may occur in a width of a formed circuit or the like. Specifically, in a miniaturized semiconductor device, the deviation has a significant effect on the characteristics of the semiconductor device.

Thus, the present invention provides a technique capable of suppressing the deviation in the characteristics of the semiconductor device.

According to an aspect of the present disclosure, there is provided a technique including:

(a) receiving data representing a thickness distribution of a polished silicon-containing layer on a substrate comprising a convex structure whereon the polished silicon-containing layer is formed;

(b) calculating, based on the data, a process data for reducing a difference between a thickness of a portion of the polished silicon-containing layer formed at a center portion of the substrate and that of the polished silicon-containing layer formed at a peripheral portion of the substrate;

(c) loading the substrate into a process chamber;

(d) supplying a process gas to the substrate; and (e) compensating for the difference based on the process data by activating the process gas with a magnetic field having a predetermined strength on the substrate.

BRIEF DESCRIPTION OF THE DRAWINGS

FIG. 8A and 8B are explanatory diagrams illustrating a substrate according to an embodiment of the present invention.

DETAILED DESCRIPTION OF THE PREFERRED EMBODIMENTS

Hereinafter, an embodiment of the present invention will be described.

First, a process of manufacturing a semiconductor device using a fin field effect transistor (FET) which is a multi-gate device which is one of semiconductor devices as an example will be described with reference to FIGS. 1 through 4C.

Figure 1:
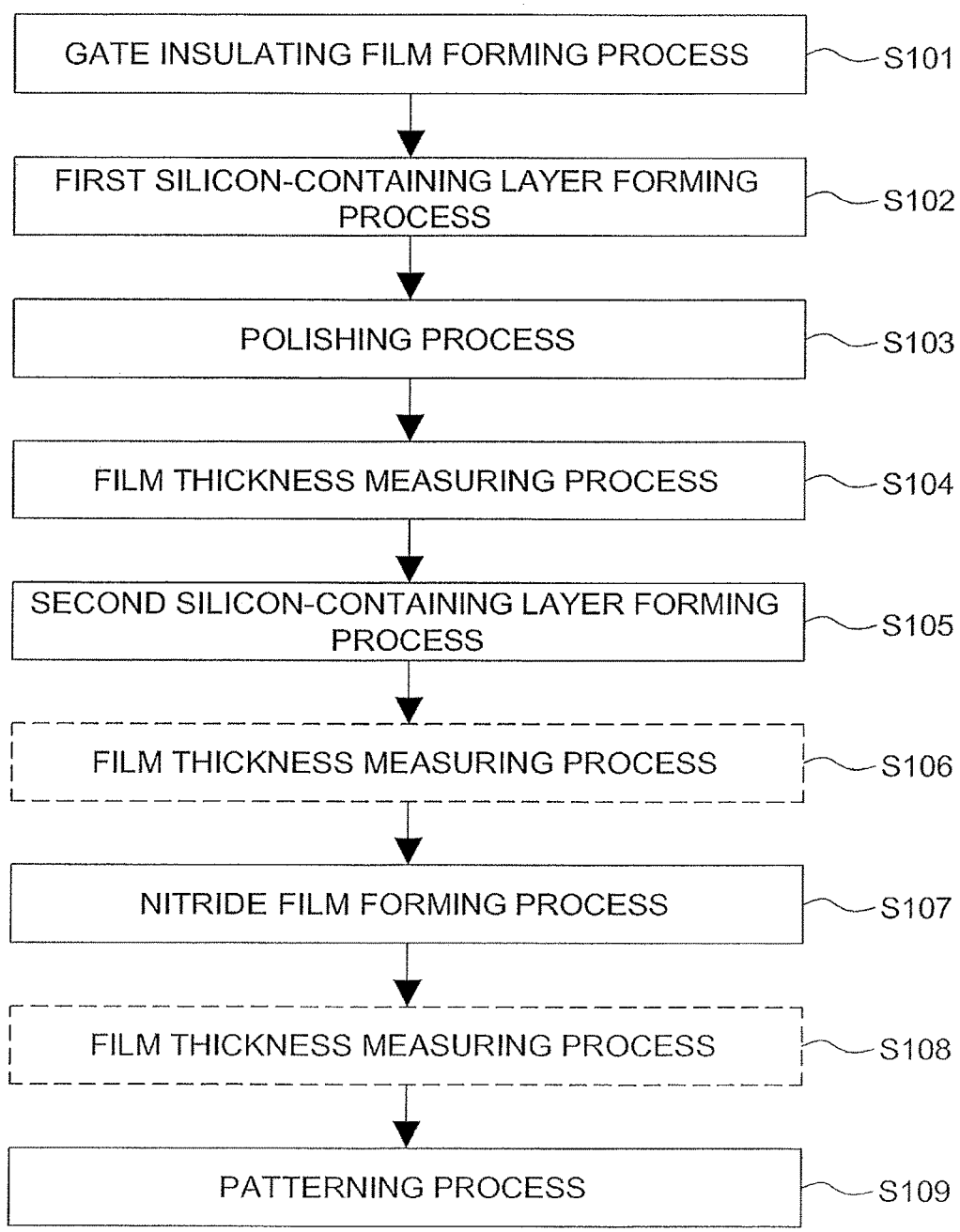
FIG. 1 is an explanatory diagram illustrating a manufacturing flow of a semiconductor device according to an embodiment of the present invention.
Figure 2:
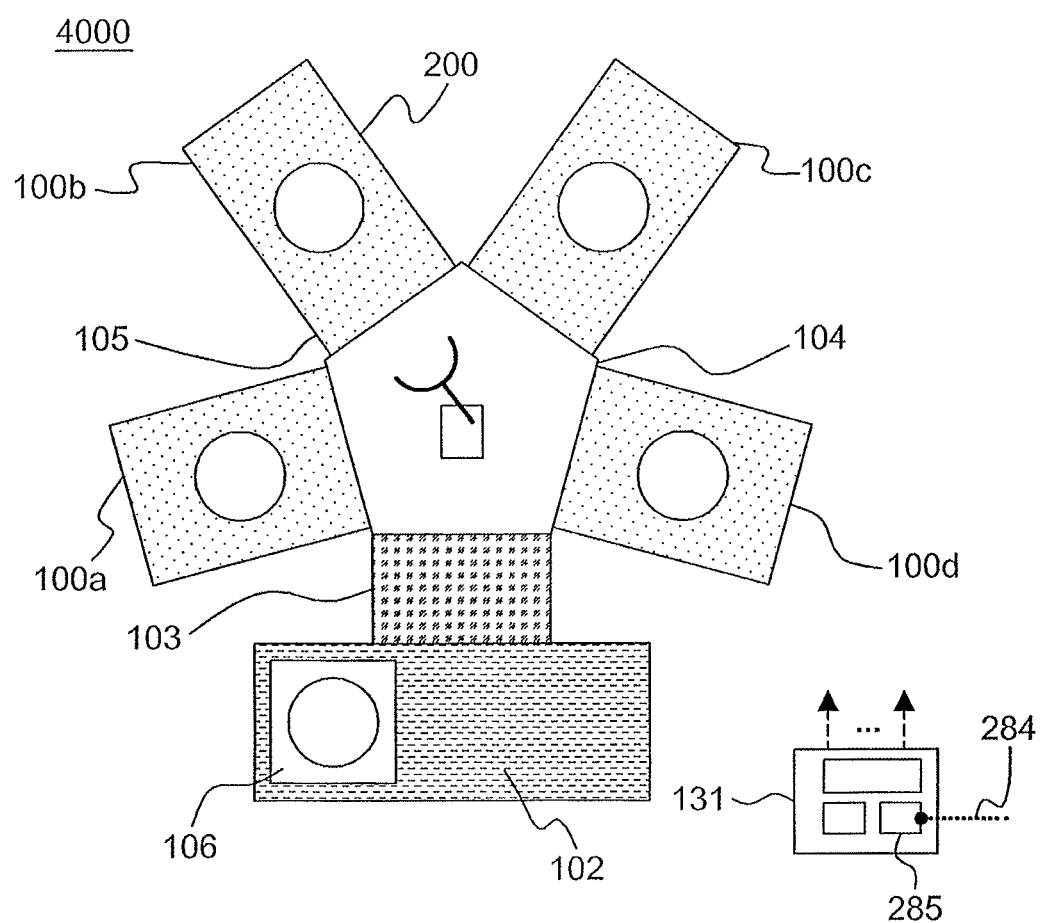
FIG. 2 is a view schematically illustrating a configuration of a processing system for performing a process of manufacturing a semiconductor device according to an embodiment of the present invention.

A semiconductor device according to a manufacturing flow illustrated in FIG. 1 is manufactured, for example, by a processing system 4000 illustrated in FIG. 2.

[Gate insulating film forming process (S101)]

Figure 3A:
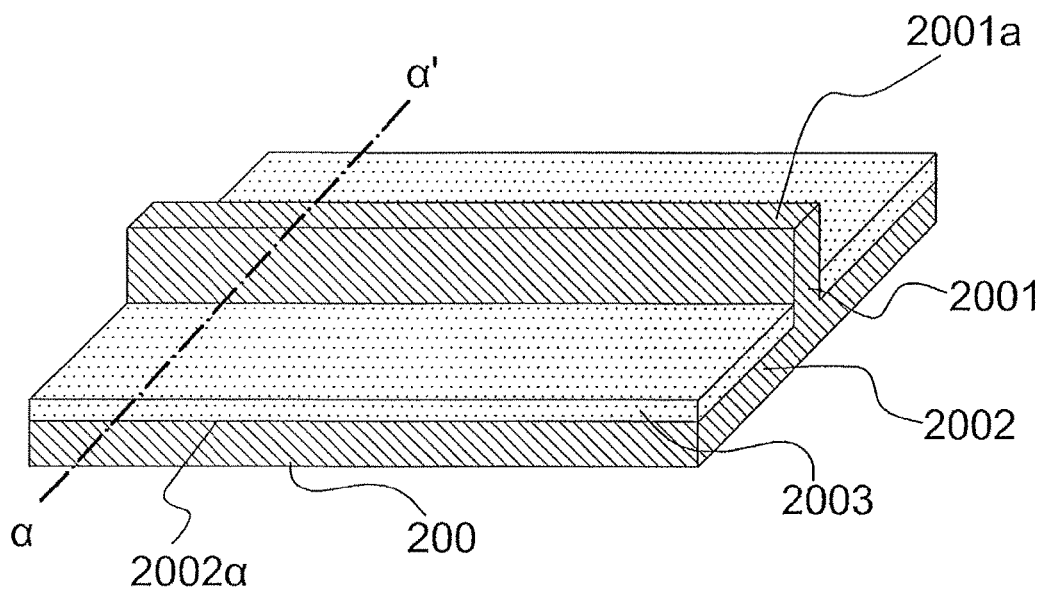
FIGS. 3A and 3B are explanatory diagrams illustrating a substrate according to an embodiment of the present invention.
Figure 3B:
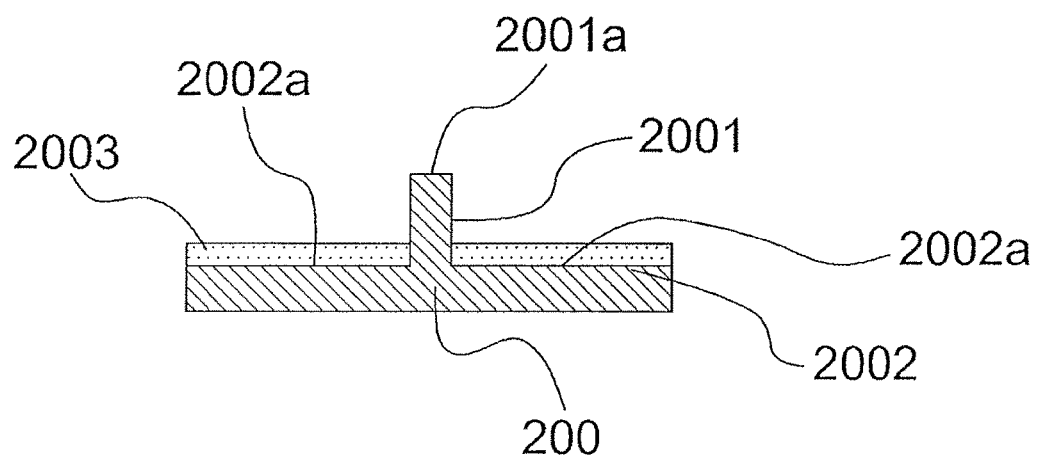

In a gate insulating film forming process (S101), for example, a substrate 200 illustrated in FIGS. 3A and 3B is loaded into a gate insulating film forming apparatus (not illustrated). FIG. 3A is a perspective view for describing the substrate 200 and FIG. 3B is a cross-sectional view taken along line α-α' of FIG. 3A. The substrate 200 is formed of silicon or the like, and a convex structure 2001 serving as a channel is formed on a portion thereof. A plurality of convex structures 2001 formed to be spaced apart from each other by a predetermined gap. The convex structures 2001 are formed by etching a portion of the substrate 200.

For convenience of description, a portion having no convex structure on the substrate 200 is referred to as a concave structure 2002. That is, the substrate 200 includes at least the convex structure 2001 and the concave structure 2002. Also, in the present embodiment, an upper surface of the convex structure 2001 is referred to as a convex structure surface 2001a and an upper surface of the concave structure 2002 is referred to as a concave structure surface 2002a for convenience of description.

A device isolation film 2003 for electrically insulating the convex structures is formed on the concave structure surface 2002a between adjacent convex structures. The device isolation film 2003 is formed with, for example, a silicon oxide film.

Figure 4A:
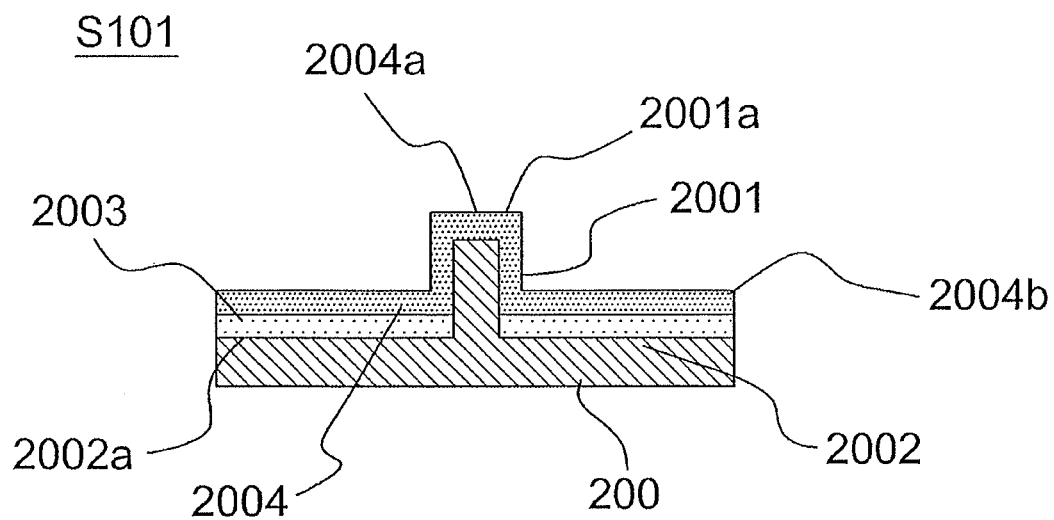
FIGS. 4A through 4C are explanatory diagrams illustrating a portion of a manufacturing flow of a semiconductor device according to an embodiment of the present invention.

The gate insulating film forming apparatus is a known single substrate processing apparatus capable of forming a thin film, and thus description thereof is omitted. In the gate insulating film forming apparatus, a gate insulating film 2004 formed of a dielectric such as a silicon oxide film (a $SiO_2$ film) or the like is formed as illustrated in FIG. 4A. A silicon-containing gas [e.g., hexachlorodisilane (HCDS) gas] and an oxygen-containing gas (e.g., $O_3$ gas) are supplied onto the gate insulating film forming apparatus and the gate insulating film 2004 is formed by reacting these gases. The gate insulating film 2004 is formed above the convex structure surface 2001a and the concave structure surface 2002a. After the gate insulating film 2004 is formed, the substrate 200 is unloaded from the gate insulating film forming apparatus.

[First Silicon-Containing Layer Forming Process (S102)]

Figure 4B:
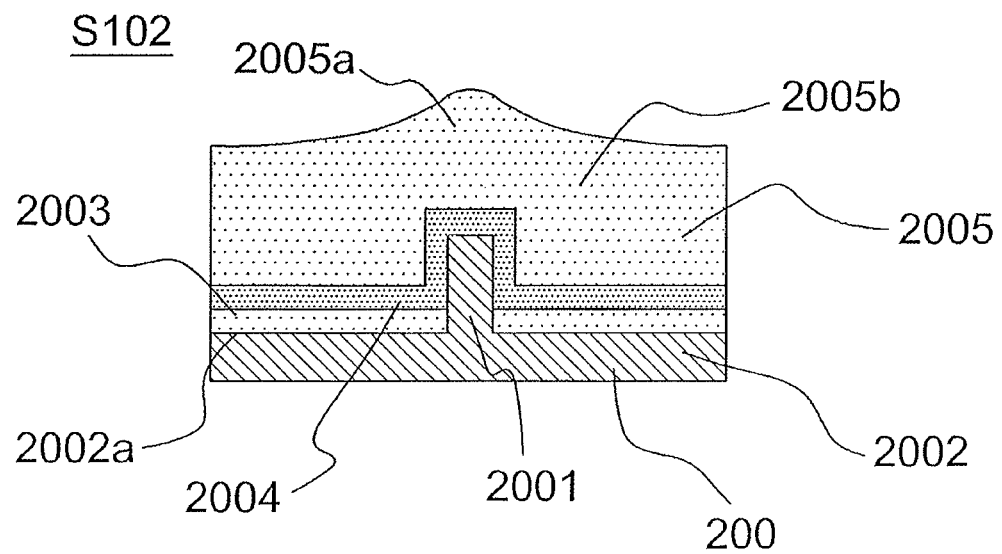

Next, a first silicon-containing layer forming process (S102) will be described. After the substrate 200 is unloaded from the gate insulating film forming apparatus, the substrate 200 is loaded into a first silicon-containing layer forming device 100a. Since a general single substrate processing chemical vapor deposition (CVD) apparatus is used as the first silicon-containing layer forming device 100a, description thereof is omitted. Referring to FIG. 4B, a first silicon-containing layer 2005 [referred to as a first poly-Si layer 2005 or simply referred to as a poly-Si layer 2005] formed of poly-Si (polycrystalline silicon) is formed on the gate insulating film 2004 using the first silicon-containing layer forming device 100a. When the poly-Si layer 2005 is formed, disilane ($Si_2H_6$) gas is supplied onto the first silicon-containing layer forming device 100a, and the poly-Si layer is formed by thermal decomposition of the gas. The poly-Si layer is used as a gate electrode or a dummy gate electrode. After the poly-Si layer 2005 is formed, the substrate 200 is unloaded from the first silicon-containing layer forming device 100a.

[Polishing Process (S103)]

Next, a chemical mechanical polishing (CMP) process (S103) will be described. The substrate 200 unloaded from the first silicon-containing layer forming device 100a is loaded into a polishing apparatus 400 (100b).

Here, the poly-Si layer formed by the first silicon-containing layer forming device 100a will be described. As illustrated in FIG. 4B, since the substrate 200 has the convex structure 2001 and the concave structure 2002, a height of the poly-Si layer is changed. Specifically, a height from the concave structure surface 2002a to a surface of the poly-Si layer 2005a on the convex structure 2001 is greater than a height from the concave structure surface 2002a to a surface of the poly-Si layer 2005b on the concave structure surface 2002a.

However, due to a relationship between either an exposure process or an etching process to be described below or both thereof, there is a need to adjust the height of the poly-Si layer 2005a and the height of the poly-Si layer 2005b. Thus, as in the present process, the height thereof is adjusted by polishing the poly-Si layer 2005.

Hereinafter, the CMP process will be described in detail. After the substrate 200 is unloaded from the first silicon-containing layer forming device, the substrate 200 is loaded into the CMP apparatus 400 (100b) illustrated in FIG. 5.

Figure 5:
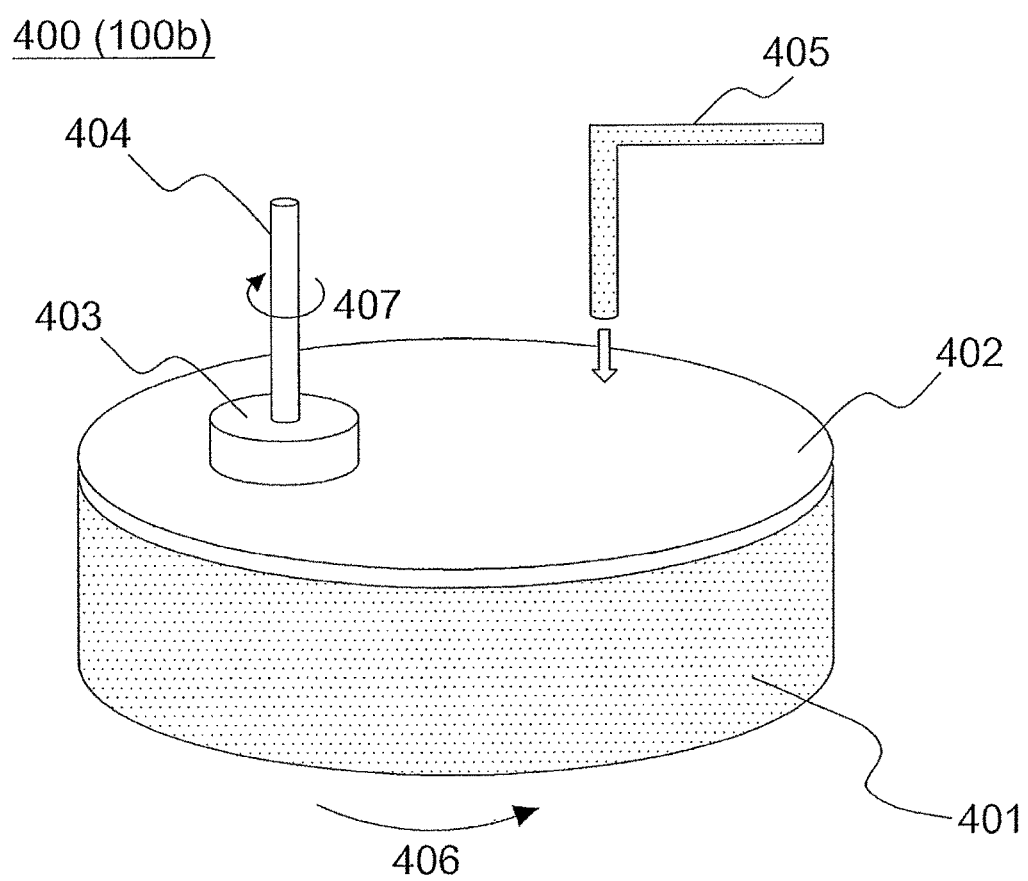
FIG. 5 is an explanatory diagram illustrating a polishing apparatus according to an embodiment of the present invention.

In FIG. 5, reference numeral 401 refers to a polishing plate and reference numeral 402 refers to a polishing cloth for polishing the substrate 200. The polishing plate 401 is connected to a rotating mechanism (not illustrated) and rotates in a direction of an arrow 406 during polishing the substrate 200.

Reference numeral 403 refers to a polishing head, and a shaft 404 is connected to an upper surface of a polishing head 403. The shaft 404 is connected to the rotating mechanism and a vertical driving mechanism (not illustrated). While the substrate 200 is being polished, the shaft 404 rotates in a direction of an arrow 407.

Reference numeral 405 refers to a supply pipe for supplying slurry (abrasive). While the substrate 200 is being polished, the slurry is supplied from the supply pipe 405 onto the polishing cloth 402.

Figure 6:
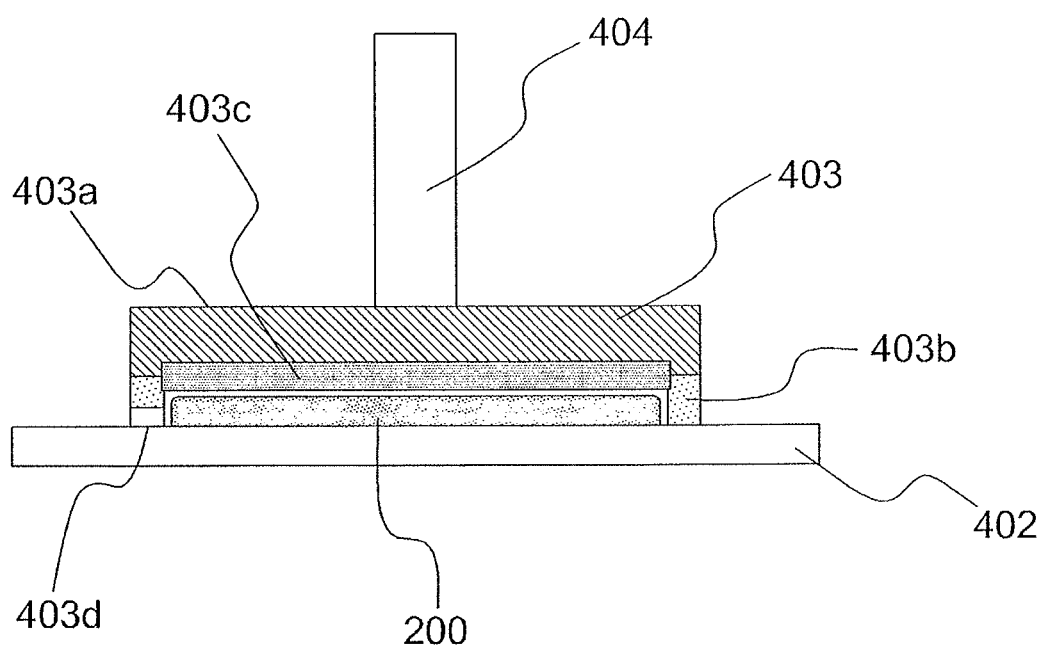
FIG. 6 is an explanatory diagram illustrating a polishing apparatus according to an embodiment of the present invention.

FIG. 6 is a cross-sectional view for describing the polishing head 403 and peripheral structures thereof. The polishing head 403 includes a top ring 403a, a retainer ring 403b and an elastic mat 403c. While the substrate 200 is being polished, a peripheral portion of the substrate 200 is surrounded by the retainer ring 403b, and at the same time, is pressed by the polishing cloth 402 by the elastic mat 403c. A groove 403d through which the slurry is passed is formed in the retainer ring 403b from an outside of the retainer ring 403b to an inside thereof. A plurality of grooves 403d are installed in a cylindrical shape to match a shape of the retainer ring 403b. It is configured such that used slurry is replaced by unused fresh slurry through the groove 403d.

Figure 4C:
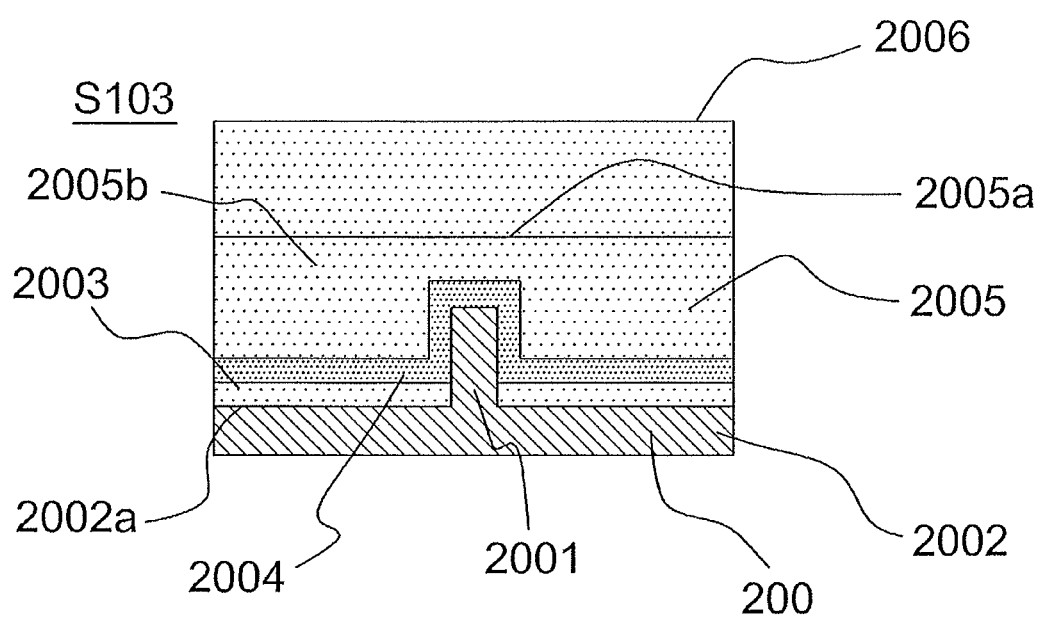

Next, operations in the present process will be described. When the substrate 200 is loaded into the polishing head 403, the slurry is supplied through the supply pipe 405, and at the same time the polishing plate 401 and the polishing head 403 rotate. The slurry flows into the retainer ring 403b and polishes a surface of the substrate 200. By polishing in this manner, as illustrated in FIG. 4C, the heights of the poly-Si layer 2005a and the poly-Si layer 2005b are adjusted. The heights herein refer to the heights of upper ends of the poly-Si layer 2005a and the poly-Si layer 2005b. After the polishing is performed for a predetermined time, the substrate 200 is unloaded from the CMP apparatus 400.

Figure 7:
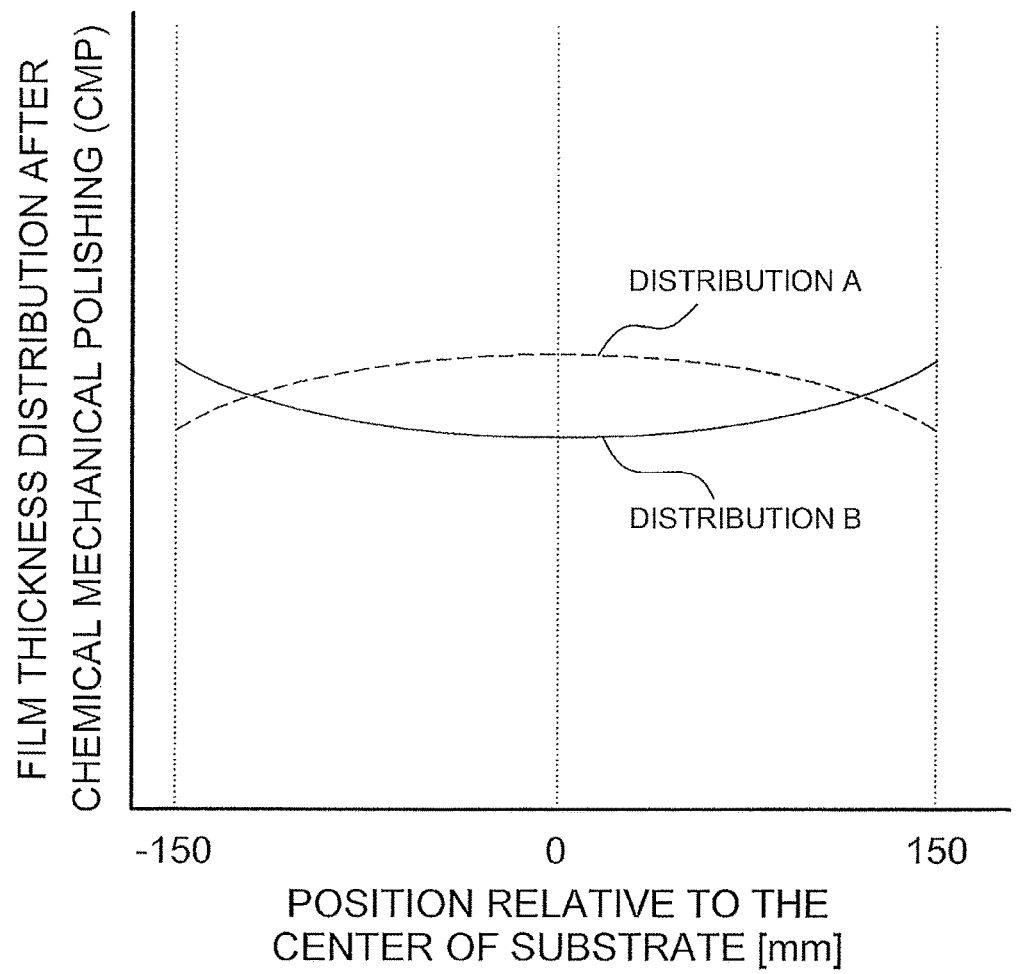
FIG. 7 is a graph illustrating a normal distribution of a silicon-containing layer in a surface of a substrate after a chemical mechanical polishing (CMP) process according to an embodiment of the present invention.

Here, although the poly-Si layer 2005a and the poly-Si layer 2005b are polished by the CMP apparatus 400 to adjust the heights thereof, it is seen that the height of the poly-Si layer after the polishing is not adjusted in a surface of the substrate 200. For example, as illustrated in FIG. 7, it is seen that there is a distribution A in which a film thickness of the peripheral portion of the substrate 200 is smaller than that of a center portion thereof or a distribution B in which the film thickness of the center portion of the substrate 200 is greater than that of the peripheral portion thereof.

Since a deviation in a width of a pattern occurs in a lithography process or an etching process to be described below when there is a deviation in the film thickness distribution, a deviation in a width of a gate or a width of a gate electrode occurs due to the deviation. As a result, there is the challenge that the yield is decreased.

To deal with this problem, according to the results of intensive research by the inventors, it is seen that there are causes for the distribution A and the distribution B. Hereinafter, the causes will be described.

The cause in the distribution A is a method of supplying the slurry to the substrate 200. As described above, the slurry supplied onto the polishing cloth 402 is supplied through the retainer ring 403b via the vicinity of the substrate 200. Therefore, while the slurry that polished the peripheral portion of the substrate 200 flows into the center portion of the substrate 200, unused fresh slurry flows onto the peripheral portion of the substrate 200. Since the fresh slurry has a high polishing efficiency, the peripheral portion of the substrate 200 is more polished than the center portion thereof. From the above, it is seen that the film thickness of the poly-Si layer becomes the same as the distribution A.

The cause in the distribution B is the wear of the retainer ring 403b. When a large number of the substrates 200 are polished in the CMP apparatus (polishing apparatus) 400, a front end of the retainer ring 403b pressed by the polishing cloth 402 is worn and a surface in contact with the groove 403d or the polishing cloth 402 is deformed. Therefore, there is a case in which the slurry originally designed to be supplied is not supplied onto an inner peripheral portion of the retainer ring 403b. In this case, since the slurry is not supplied onto the peripheral portion of the substrate 200, the center portion of the substrate 200 is over polished, and the peripheral portion of the substrate 200 is not polished. Therefore, it is seen that the film thickness of the poly-Si layer becomes the same as the distribution B.

Thus, in the present embodiment, as described below, after the poly-Si layer on the substrate 200 is polished in the CMP apparatus 400, the height of the poly-Si layer is adjusted. In such a configuration, the deviation of the width of the pattern in the exposure process or the etching process is suppressed. Specifically, in a film thickness measuring process after the CMP process (S103), the film thickness distribution of the poly-Si layer 2005 is measured, and a second silicon-containing layer forming process is performed based on the measured data.

[Film Thickness Measuring Process (S104)]

Next, a film thickness measuring process (S104) will be described. In the film thickness measuring process (S104), a film thickness of a poly-Si layer 2005 after the polishing is measured using a general measuring apparatus 100c. Since a general apparatus may be used as the measuring apparatus 100c, detailed description thereof is omitted. The film thickness herein refers to, for example, a height from the concave structure surface 2002a to a surface of the poly-Si layer 2005.

After the CMP process (S103), the substrate 200 is loaded into the measuring apparatus 100c. The measuring apparatus 100c measures the film thickness (height) distribution of the poly-Si layer 2005 by measuring at least several positions of the center portion of the substrate 200 and the peripheral portion of the substrate 200, which are easily affected by the polishing apparatus 400. Measured data is transmitted to the substrate processing apparatus 100. After the measuring process, the substrate 200 is unloaded from the measuring apparatus 100c.

[Second Silicon-Containing Layer Forming Process (S105)]

Next, a second silicon-containing layer forming process will be described. A second silicon-containing layer 2006 is a poly-Si layer and has the same configuration as the first silicon-containing layer 2005. As illustrated in FIGS. 4C and 8B, the second silicon-containing layer 2006 is formed on the first silicon-containing layer 2005 after the polishing. Also, a layer in which the first silicon-containing layer 2005 and the second silicon-containing layer 2006 are stacked is referred to as a stacked silicon-containing layer.

The second silicon-containing layer 2006 [referred to as a second poly-Si layer 2006 or simply referred to as a poly-Si layer 2006 or a compensation film] is formed to compensate for the film thickness distribution of the first silicon-containing layer 2005 after the polishing. Preferably, the second silicon-containing layer 2006 is formed such that a height of a surface of the second silicon-containing layer 2006 is adjusted in the surface of the substrate 200. The height herein refers to a height to the surface of the second silicon-containing layer 2006, and in other words, refers to a distance from the concave structure surface 2002a to the surface of the second silicon-containing layer 2006.

Figure 9A:
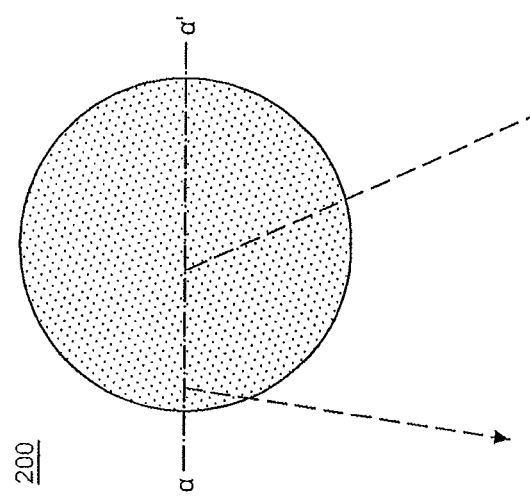
FIG. 9A and 9B are explanatory diagrams illustrating a processing state of a substrate according to an embodiment of the present invention.
Figure 9B:
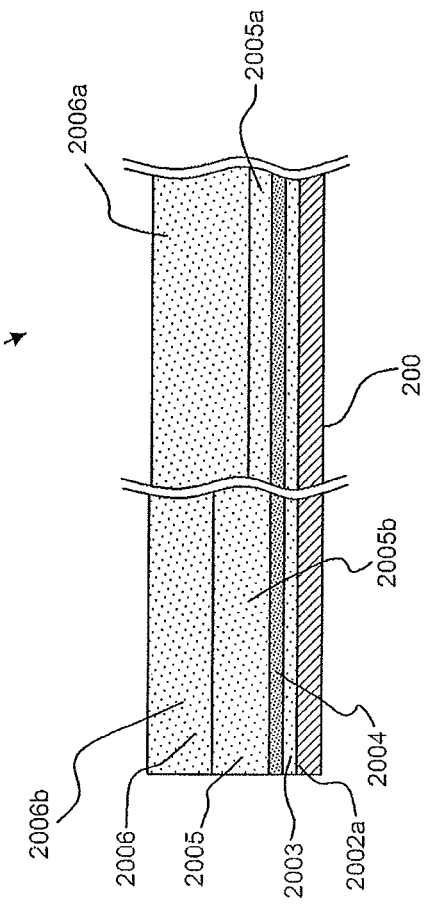
Figure 10:
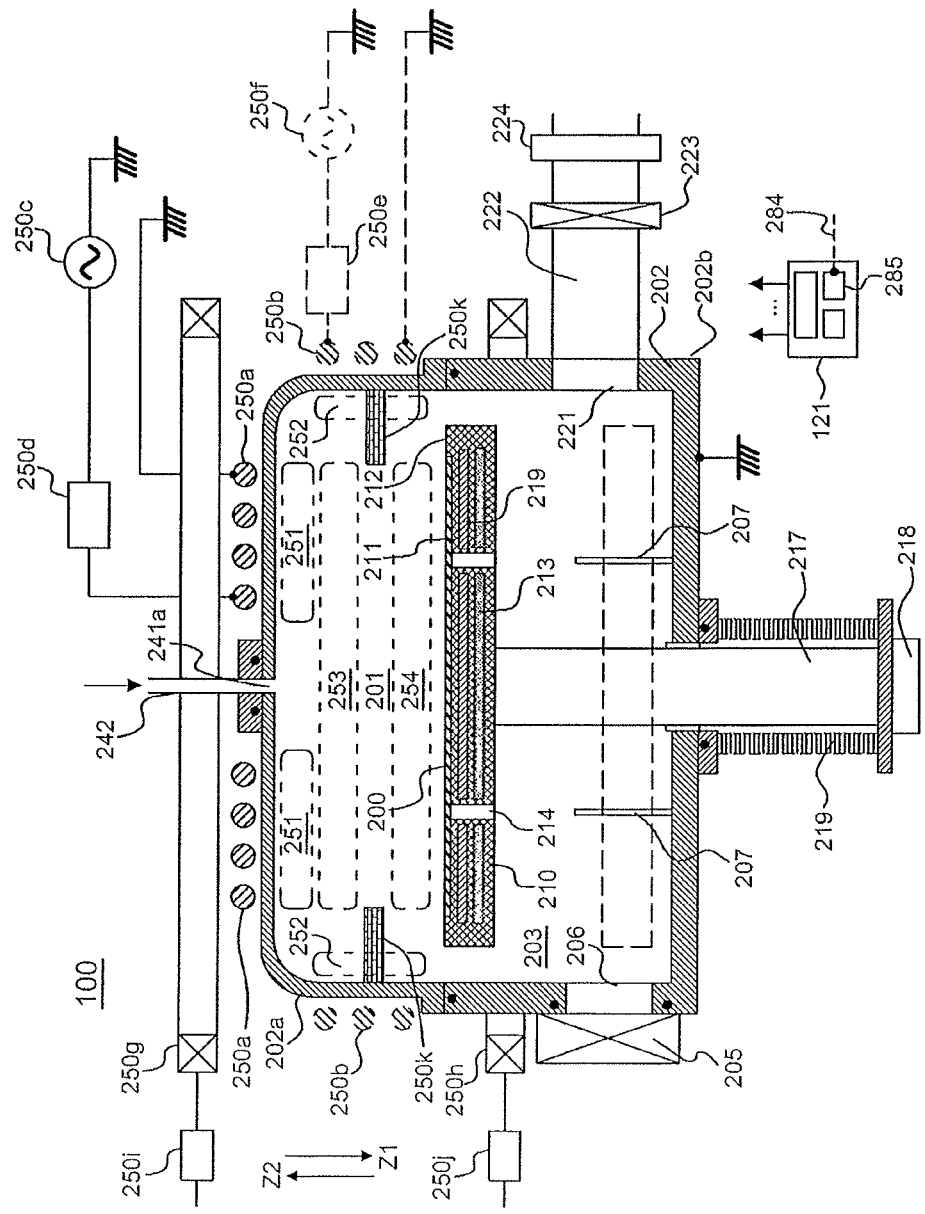
FIG. 10 is an explanatory diagram illustrating a substrate processing apparatus according to an embodiment of the present invention.

Hereinafter, the present process will be described with reference to FIGS. 8A, 8B, 9A, 9B and 10. FIG. 8A and 8B are views for describing the second poly-Si layer 2006 formed in the present process when the first poly-Si layer 2005 is the distribution A. FIG. 9A and 9B are views for describing the second poly-Si layer 2006 formed in the present process when the first poly-Si layer 2005 is the distribution B. FIG. 10 is an explanatory diagram illustrating the substrate processing apparatus 100 (100a) for implementing the present process.

FIG. 8A is a top view illustrating the substrate 200 after forming the second poly-Si layer 2006. FIG. 8B is a view illustrating a portion of the center portion of the substrate 200 and the peripheral portion thereof in a cross-sectional taken along line α-α' of FIG. 8A.

FIG. 9A is a top view illustrating the substrate 200 after forming the second poly-Si layer 2006. FIG. 9B is a view illustrating a portion of the center portion of the substrate 200 and the peripheral portion thereof in a cross-sectional view taken along line α-α' of FIG. 9A.

Here, the second poly-Si layer 2006 in the center portion of the substrate 200 is referred to as a poly-Si layer 2006a, and the second poly-Si layer 2006 in the peripheral portion thereof is referred to as a second poly-Si layer 2006b.

The substrate 200 unloaded from the measuring apparatus 100c is loaded into the substrate processing apparatus 100 illustrated in FIG. 10, which is a second silicon-containing layer forming apparatus 100 (100a).

The substrate processing apparatus 100 controls the film thickness of the poly-Si layer 200b in the surface of the substrate based on the film thickness distribution data measured in the film thickness measuring process (S104). First, predetermined process data is calculated by a controller 121 based on data received by a receiving unit 285 installed in the controller 121. For example, when the received data is the distribution A, the poly-Si layer 2006b in the peripheral portion of the substrate 200 is formed to be thick, and the film thickness is controlled such that a layer is formed to have the thickness of the poly-Si layer 2006a in the center portion thereof smaller than that of the poly-Si layer 2006a in the peripheral portion thereof. Also, when the data received from the upper apparatus is the distribution B, the poly-Si layer 2006a in the center portion of the substrate 200 is formed to be thick, and the film thickness is controlled such that a layer is formed to have the thickness of the poly-Si layer 2006b in the peripheral portion thereof smaller than that of the poly-Si layer 2006a in the center portion thereof.

Preferably, the thickness of the second poly-Si layer 2006 is controlled such that a height in which the first poly-Si layer 2005 and the second poly-Si layer 2006 are stacked on the concave structure surface 2002a is a predetermined height in the surface of the substrate 200. In other words, the film thickness distribution of the second silicon-containing layer is controlled such that the distribution of the height of the second silicon-containing layer in the surface of the substrate 200 is within a predetermined range.

Next, the substrate processing apparatus 100 for forming the second poly-Si layer 2006 capable of controlling the film thickness of each of the poly-Si layers 2006a and 2006a will be described in detail.

The substrate processing apparatus 100 according to the present embodiment will be described. The substrate processing apparatus 100 is configured as a single substrate processing apparatus as illustrated in FIG. 10. The substrate processing apparatus 100 is used in one process of manufacturing a semiconductor device. Here, the substrate processing apparatus 100 is used in a second silicon-containing layer forming process (S105).

As illustrated in FIG. 10, the substrate processing apparatus 100 includes a process container 202. The process container 202 includes, for example, an airtight container with a circular and flat cross section. A process space (process chamber) 201 which processes a silicon wafer or the like serving as a substrate and a transfer space 203 are formed in the process container 202. The process container 202 includes an upper container 202a and a lower container 202b. The upper container 202a is made of, for example, a non-metallic material such as quartz, ceramics or the like and the lower container 202b is made of, for example, a metallic material such as aluminum (Al), stainless steel (SUS) or the like or quartz. A space above the substrate placement unit 212 is referred to as a process space 201, and a space under the substrate placement unit 212, which is surrounded by the lower container 202b, is referred to as a transfer space 203.

A substrate loading and unloading port 206 is installed adjacent to a gate valve 205 on a side surface of the lower container 202b and the substrate 200 moves to a transfer chamber 104 through the substrate loading and unloading port 206. A plurality of lift pins 207 are installed at a bottom portion of the lower container 202b. Also, the lower container 202b is at a ground potential.

[Substrate Placement Unit]

A substrate support 210 which supports the substrate 200 is installed in the process space 201. The substrate support (susceptor) 210 mainly includes a placement surface 211 on which the substrate 200 is placed, a substrate placement unit 212 whose surface has the placement surface 211 and a heater 213 serving as a heating source embedded in the substrate placement unit 212. Through holes 214 through which the lift pins 207 pass are installed in the substrate placement unit 212 at positions corresponding to the lift pins 207.

The substrate placement unit 212 is supported by a shaft 217. The shaft 217 passes through a bottom portion of the process container 202 and is connected to a lifting mechanism 218 outside the process container 202. When the shaft 217 and the substrate placement unit 212 are lifted by operating the lifting mechanism 218, it is possible to lift the substrate 200 placed on the placement surface 211. Also, a vicinity of a lower end of the shaft 217 is covered with a bellows 219, and thus an inside of the process space 201 is air-tightly retained.

The substrate placement unit 212 is lowered to the substrate placement unit such that the placement surface 211 is at a position of the substrate loading and unloading port 206 (substrate transfer position) when the substrate 200 is transferred, and is lifted to a processing position (substrate processing position) at which the substrate 200 is positioned in the process space 201 as illustrated in FIG. 10 when the substrate 200 is processed.

Specifically, when the substrate placement unit 212 is lowered to the substrate transfer position, upper ends of the lift pins 207 protrude from an upper surface of the placement surface 211 and the lift pins 207 support the substrate 200 from below. Also, when the substrate placement unit 212 is lifted to the substrate processing position, the lift pins 207 are buried under the upper surface of the placement surface 211 and the placement surface 211 supports the substrate 200 from below. Also, since the lift pins 207 are directly in contact with the substrate 200, the lift pins 207 are preferably formed of a material such as quartz, alumina or the like.

Figure 11:
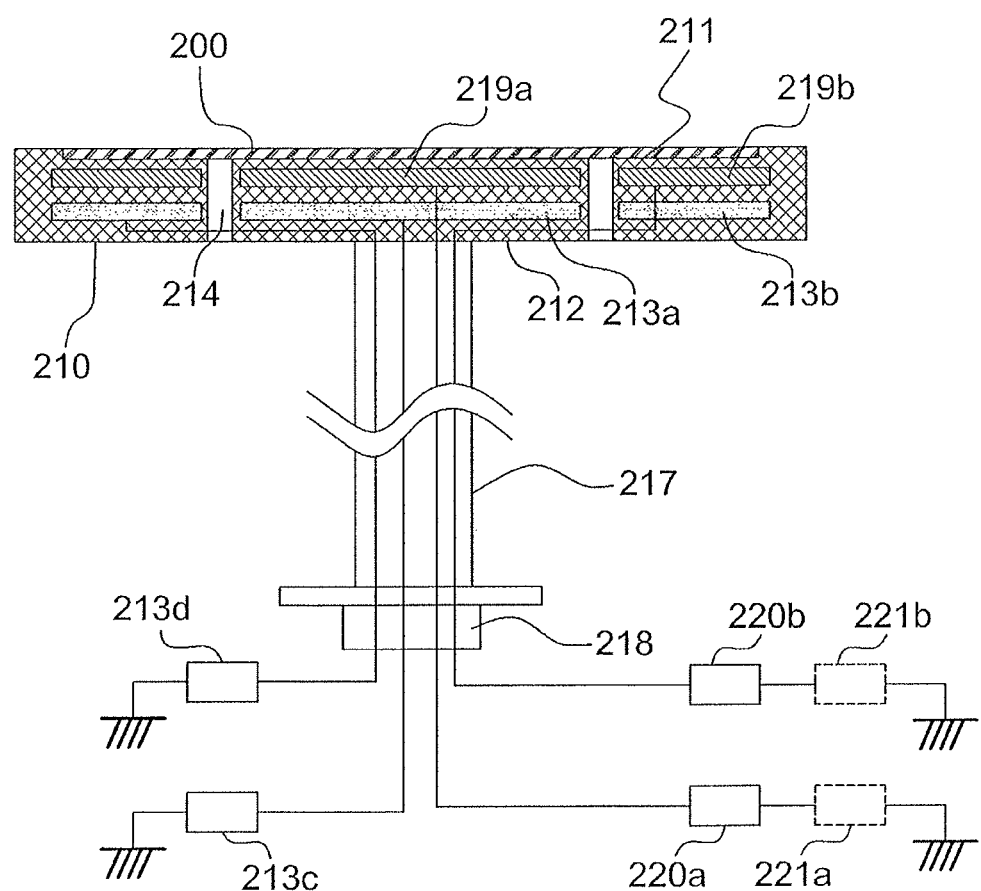
FIG. 11 is an explanatory diagram illustrating a substrate support according to an embodiment of the present invention.
Figure 12:
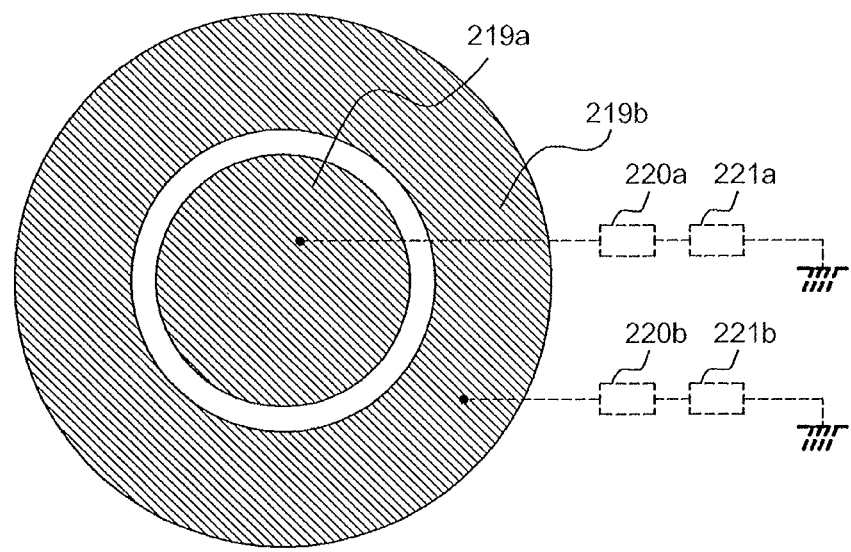
FIG. 12 is an explanatory diagram illustrating a substrate support according to an embodiment of the present invention.

Also, as illustrated in FIG. 11, a first bias electrode 219a and a second bias electrode 219b serving as the bias adjuster 219 are installed in the substrate placement unit 212. The first bias electrode 219a is connected to a first impedance adjuster 220a and the second bias electrode 219b is connected to a second impedance adjuster 220b, and thus it is configured to adjust electric potential of each of the electrodes. Also, as illustrated in FIG. 12, the first bias electrode 219a and the second bias electrode 219b are formed in a concentric circular shape and are configured to adjust the electric potential at the center portion of the substrate 200 and the peripheral portion thereof.

Also, it may be configured such that a first impedance adjusting power 221a is installed in the first impedance adjuster 220a and the second impedance adjusting power 221b is installed in the second impedance adjuster 220b. By installing the first impedance adjusting power 221a, an adjustment width of the electric potential of the first bias electrode 219a may be increased, and an adjustment width of an amount of active species which flow into the center portion of the substrate 200 may be increased. Also, by installing the second impedance adjusting power 221b, an adjustment width for the electric potential of the second bias electrode 219b may be increased, and an adjustment width for the amount of active species which flow into the peripheral portion of the substrate 200 may be increased. For example, when the active species are at a positive potential, it is configured such that the electric potential of the first bias electrode 219a is at a negative potential and the electric potential of the second bias electrode 219b is higher than the electric potential of the first bias electrode 219a, and thus the amount of the active species supplied onto the peripheral portion of the substrate 200 may be greater than the amount of the active species supplied onto the center portion thereof. Also, even when the electric potential of the active species generated in the process chamber 201 is close to neutral, the amount of the active species which flow onto the substrate 200 may be adjusted using either the first impedance adjusting power 221a or the second impedance adjusting power 221b or both thereof.

Also, a first heater 213a and a second heater 213b may be installed as the heater 213. The first heater 213a is installed to face the first bias electrode 219a and the second heater 213b is installed to face the second bias electrode 219b. The first heater 213a is connected to the first heater power 213c and the second heater 213b is connected to the second heater power 213d, and thus it is configured for adjusting an amount of power supplied to each of the heaters.

[Activation Unit]

As illustrated in FIG. 10, a first coil 250a serving as a first activation unit (an upper activation unit) is installed above the upper container 202a. A first high frequency power 250c is connected to the first coil 250a through a first matching box 250d. When the high frequency power is supplied to the first coil 250a, a gas supplied into the process chamber 201 is excited to generate plasma. Specifically, the plasma is generated in a space [first plasma generating region 251] which is an upper portion of the process chamber 201 and faces the substrate 200. Also, it may be configured such that the plasma is generated in a space facing the substrate placement unit 212.

Also, as illustrated in FIG. 10, a second coil 250b serving as a second activation unit (a side activation unit) may be installed at a side of the upper container 202a. A second high frequency power 250f is connected to the second coil 250b through a second matching box 250e. When the high frequency power is supplied to the second coil 250b, the gas supplied into the process chamber 201 is excited to generate a plasma. Specifically, the plasma is generated in a space [second plasma generating region 252] which is a side of the process chamber 201 and faces the substrate 200. Also, it may be configured such that the plasma is generated in a space outer than the space facing the substrate placement unit 212.

Here, an example in which separate matching boxes and separate high frequency power are installed in each of the first activation unit and the second activation unit in order to individually control is illustrated, but is not limited thereto. It may be configured to use a common matching box in the first coil 250a and the second coil 250b. Also, it may be configured to use a common high frequency power in the first coil 250a and the second coil 250b.

Also, each of the first high frequency power 250c and the second high frequency power 250f may include a receiving unit and a power adjuster. The receiving unit may receive a control program (a control value) or the like received from the controller 121 and the power adjuster may adjust power according to the control program (the control value).

[Magnetic Field Generator]

As illustrated in FIG. 10, a first electromagnet (upper electromagnet) 250g serving as a first magnetic field generator is installed above the upper container 202a. A first electromagnet power 250i for supplying power to the first electromagnet 250g is connected to the first electromagnet 250g. Also, the first electromagnet 250g has a ring shape and it is configured to generate a magnetic field in a Z1 or Z2 direction as illustrated in FIG. 10. A direction of the magnetic field is controlled by a direction of current supplied from the first electromagnet power 250i.

Also, a second electromagnet (side electromagnet) 250h serving as a second magnetic field generator is installed under the substrate 200 and at a side surface of the process container 202. A second electromagnet power 250j for supplying power to the second electromagnet 250h is connected to the second electromagnet 250h. Also, the second electromagnet 250h has a ring shape and it is configured to generate the magnetic field in the Z1 or Z2 direction as illustrated in FIG. 10. The direction of the magnetic field is controlled by a direction of current supplied from the second electromagnet power 250j.

When the magnetic field is formed in the Z1 direction by any one of the first electromagnet 250g and the second electromagnet 250h, the plasma formed in the first plasma generating region 251 may move into a third plasma generating region 253 or a fourth plasma generating region 254. Also, in the third plasma generating region 253, a degree of activity of the active species generated at a position facing the center portion of the substrate 200 is greater than a degree of activity of the active species generated at a position facing the peripheral portion of the substrate 200. This occurs due to the supply of fresh gas molecules by having the gas inlet 241a installed at a position facing the center portion. Also, in the fourth plasma generating region 254, the degree of activity of the active species generated at the position facing the peripheral portion of the substrate 200 is greater than the degree of activity of the active species generated at the position facing the center portion thereof. This occurs due to the gas molecules being collected at the peripheral portion of the substrate 200 due to forming an exhaust path on the outer periphery of the substrate support 210. The position of the plasma may be controlled by the power supplied to the first electromagnet 250g and the second electromagnet 250h and the plasma may be closer to the substrate 200 by increasing the power. Also, when the magnetic field is formed by both of the first electromagnet 250g and the second electromagnet 250h in the Z1 direction, the plasma may be closer to the substrate 200. Also, when the magnetic field is formed in the Z2 direction, diffusion of the plasma formed in the first plasma generating region 251 into a direction of the substrate 200 may be suppressed, and the energy of the active species supplied onto the substrate 200 may be reduced. Also, a direction of the magnetic field formed by the first electromagnet 250g may be different from a direction of the magnetic field formed by the second electromagnet 250h. Also, each of the first electromagnet power 250i and the second electromagnet power 250j may include a receiving unit and a magnetic field strength adjuster. The receiving unit may receive a control program (the control value) or the like transmitted from the controller 121, and the magnetic field strength adjuster may adjust the strength of the magnetic field according to the control program (the control value).

Also, an electronic shield plate 250k serving as an electronic shield unit may be installed in the process chamber 201 and between the first electromagnet 250g and the second electromagnet 250h. The electronic shield plate 250k may be disposed between the first electromagnet 250g and the second electromagnet 250h, at a position in which at least some of electronic interference is suppressed, however may preferably be configured to be disposed in the process container 202. Also, preferably, the electronic shield plate 250k may be configured to be disposed inside the upper container 202a in the process container 202. Also, when the electronic shield plate 250k has a ring shape and is configured to be disposed outer than at least one of the first plasma generating region, the third plasma generating region and the fourth plasma generating region and outer than the peripheral portion of the substrate 200, interference by the magnetic field can be suppressed while maintaining the plasma generating region. Also, when the electronic shield plate 250k is installed, the magnetic field formed by the first electromagnet 250g may be separated from the magnetic field formed by the second electromagnet 250h. It is easy to adjust the processing uniformity in the surface of the substrate 200 by adjusting the respective magnetic fields. Also, it may be configured to be adjustable a height of the electronic shield plate 250k by an electronic shield plate lifting mechanism (not illustrated).

[Exhaust System]

An exhaust port 221 serving as a first exhaust unit that exhausts an atmosphere in the process space 201 is installed on an inner wall of the transfer space 203 [lower container 202b]. An exhaust pipe 222 is connected to the exhaust port 221, and a pressure regulator 223 such as an auto pressure controller (APC) which controls a pressure in the process space 201 to a predetermined pressure and a vacuum pump 224 are sequentially connected to the exhaust pipe 222 in series. An exhaust system (exhaust line) mainly includes the exhaust port 221, the exhaust pipe 222 and the pressure regulator 223. Also, the vacuum pump 224 may be added to the exhaust system (exhaust line) as a component of the configuration.

[Gas Inlet]

A gas inlet 241a for supplying various gases into the process space 201 is installed at an upper portion of the upper container 202a, and a common gas supply pipe 242 is connected thereto.

[Gas Supply Unit]

Figure 13:
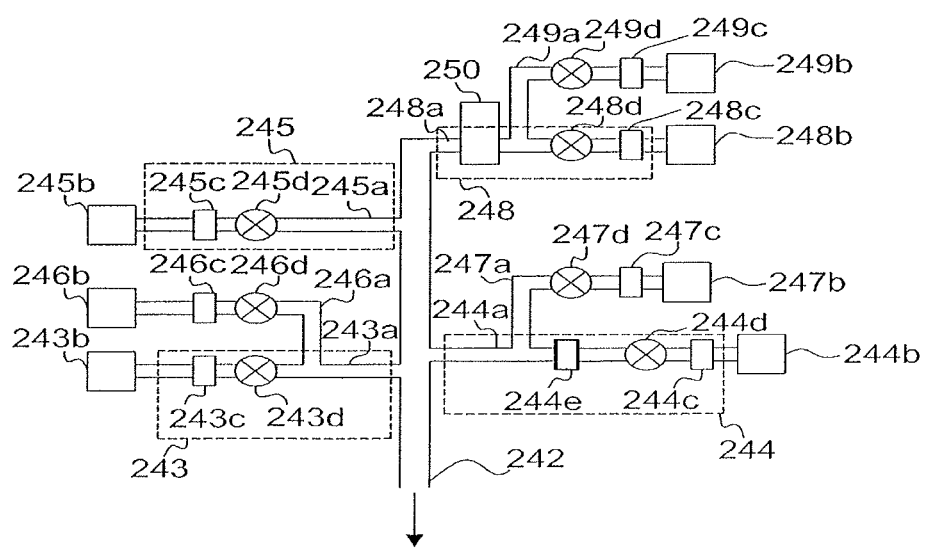
FIG. 13 is an explanatory diagram illustrating a gas supply unit according to an embodiment of the present invention.

As illustrated in FIG. 13, a first process gas supply pipe 243a, a purge gas supply pipe 245a and a cleaning gas supply pipe 248a are connected to the common gas supply pipe 242.

[Process Gas Supply Unit]

The common gas supply pipe 242 is connected to the gas inlet 241a. As illustrated in FIG. 13, the first gas supply pipe 243a, a second gas supply pipe 244a, the third gas supply pipe 245a, and the cleaning gas supply pipe 248a are connected to the common gas supply pipe 242.

A first-element-containing gas (first process gas) is mainly supplied through a first gas supply unit 243 including the first gas supply pipe 243a and a second-element-containing gas (second process gas) is mainly supplied through a second gas supply unit 244 including the second gas supply pipe 244a. A purge gas is mainly supplied through a third gas supply unit 245 including the third gas supply pipe 245a, and a cleaning gas is mainly supplied through a cleaning gas supply unit 248 including the cleaning gas supply pipe 248a. A process gas supply unit for supplying a process gas is configured as either a first process gas supply unit or a second process gas supply unit or both thereof, and the process gas is configured as either a first process gas or a second process gas or both thereof.

[First Gas Supply Unit]

In the first gas supply pipe 243a, a first gas supply source 243b, a mass flow controller (MFC) 243c serving as a flow rate controller (flow rate control unit) and a valve 243d serving as an opening and closing valve are sequentially installed from an upstream end.

A gas containing a first element (hereinafter referred to as "a first process gas") is supplied from the first gas supply source 243b and is supplied into the gas inlet 241a through the MFC 243c, the valve 243d, the first gas supply pipe 243a and the common gas supply pipe 242.

The first process gas is one of source gases, that is, the process gases. Here, the first element is, for example, silicon (Si). That is, the first process gas is, for example, a silicon-containing gas. As the silicon-containing gas, for example, dichlorosilane (DCS) (SiH$_2$Cl$_2$) gas may be used. Also, the first process gas source may be any one of a solid, a liquid and a gas at a room temperature and normal pressure. When the first process gas source is liquid at the room temperature and normal pressure, a vaporizer (not illustrated) may be installed between the first gas supply source 243b and the MFC 243c. Here, the first process gas source serving as a gas will be described.

A downstream end of a first inert gas supply pipe 246a is connected to a portion downstream from the valve 243d of the first gas supply pipe 243a. In the first inert gas supply pipe 246a, an inert gas supply source 246b, an MFC 246c and a valve 246d serving as an opening and closing valve are sequentially installed from an upstream end.

Here, the inert gas is, for example, nitrogen (N$_2$) gas. Also, as an inert gas, in addition to the N$_2$ gas, rare gases such as helium (He) gas, neon (Ne) gas, argon (Ar) gas and the like may be used.

A first-element-containing gas supply unit 243 (referred to as a silicon-containing gas supply unit) mainly includes the first gas supply pipe 243a, the MFC 243c and the valve 243d.

Also, a first inert gas supply unit mainly includes the first inert gas supply pipe 246a, the MFC 246c and the valve 246d. Also, the inert gas supply source 246b and the first gas supply pipe 243a may be considered as being included in the first inert gas supply unit.

Also, the first gas supply source 243b and the first inert gas supply unit may be considered as being included in the first-element-containing gas supply unit.

[Second Gas Supply Unit]

In the second gas supply pipe 244a, a second gas supply source 244b, an MFC 244c and a valve 244d serving as an opening and closing valve are sequentially installed from an upstream end.

A gas containing a second element (hereinafter referred to as "a second process gas") is supplied from the second gas supply source 244b and is supplied into the gas inlet 241 a through the MFC 244c, the valve 244d, the second gas supply pipe 244a and the common gas supply pipe 242.

The second process gas is one of the process gases. Also, the second process gas may be a reactive gas or a modifying gas.

Here, the second process gas contains a second element different from the first element. The second element is, for example, a hydrogen-containing gas. Specifically, hydrogen (H) gas is used as the hydrogen-containing gas.

A second process gas supply unit 244 mainly includes the second gas supply pipe 244a, the MFC 244c and the valve 244d.

In addition, a remote plasma unit (RPU) 244e serving as an activation unit may be installed and may activate the second process gas.

Also, a downstream end of a second inert gas supply pipe 247a is connected to a portion downstream from the valve 244d of the second gas supply pipe 244a. In the second inert gas supply pipe 247a, an inert gas supply source 247b, an MFC 247c and a valve 247d serving as an opening and closing valve are sequentially installed from an upstream end.

An inert gas is supplied into the gas inlet 241 a through the second inert gas supply pipe 247a via the MFC 247c, the valve 247d and the second inert gas supply pipe 247a. The inert gas serves as a carrier gas or a dilution gas in a thin film forming process (Operations S4100 to S4005 to be described below).

A second inert gas supply unit mainly includes the second inert gas supply pipe 247a, the MFC 247c and the valve 247d. Also, the inert gas supply source 247b and the second gas supply pipe 244a may be included in the second inert gas supply unit.

Also, the second gas supply source 244b and the second inert gas supply unit may be included in the second process gas supply unit 244.

[Third Gas Supply Unit]

In the third gas supply pipe 245a, a third gas supply source 245b, an MFC 245c serving as a flow rate controller (flow rate control unit) and a valve 245d serving as an opening and closing valve are sequentially installed from an upstream end.

An inert gas serving as a purge gas is supplied from the third gas supply source 245b and is supplied into the gas inlet 241a through the MFC 245c, the valve 245d, the third gas supply pipe 245a and the common gas supply pipe 242.

Here, the inert gas is, for example, nitrogen ($N_2$) gas. Also, as the inert gas, in addition to the $N_2$ gas, rare gases such as helium (He) gas, neon (Ne) gas, argon (Ar) gas and the like may be used.

The third gas supply unit 245 (referred to as a purge gas supply unit) mainly includes the third gas supply pipe 245a, the MFC 245c and the valve 245d.

[Cleaning Gas Supply Unit]

In the cleaning gas supply pipe 243a, a cleaning gas supply source 248b, an MFC 248c, a valve 248d and an RPU 250 are sequentially installed from an upstream end.

A cleaning gas is supplied from the cleaning gas supply source 248b and is supplied into the gas inlet 241a through the MFC 248c, the valve 248d, the RPU 250, the cleaning gas supply pipe 248a and the common gas supply pipe 242.

A downstream end of a fourth inert gas supply pipe 249a is connected to a portion downstream from the valve 248d of the cleaning gas supply pipe 248a. In the fourth inert gas supply pipe 249a, a fourth inert gas supply source 249b, an MFC 249c and a valve 249d are sequentially installed from an upstream end.

Also, a cleaning gas supply unit mainly includes the cleaning gas supply pipe 248a, the MFC 248c and the valve 248d. Also, the cleaning gas supply source 248b, the fourth inert gas supply pipe 249a and the RPU 250 may be included in the cleaning gas supply unit.

Also, the inert gas supplied from the fourth inert gas supply source 249b may be supplied to serve as a carrier gas or a dilution gas of the cleaning gas.

The cleaning gas supplied from the cleaning gas supply source 248b serves as the cleaning gas for removing by-products and the like attached to the gas inlet 241 a or the process chamber 201 in a cleaning process.

Here, the cleaning gas is, for example, nitrogen trifluoride ($NF_3$) gas. Also, as the cleaning gas, hydrogen fluoride (HF) gas, chlorine trifluoride ($ClF_3$) gas, fluorine ($F_2$) gas or a combination thereof may be used.

Also, preferably, as the flow rate control unit installed in each of the above-described gas supply units, a flow rate control unit such as a needle valve or an orifice having high responsiveness with respect to the gas flow may be used. For example, although it may not be responsive in the MFC when the pulse width of the gas becomes of the order of milliseconds, it is possible to respond to the gas pulse of a millisecond or less in the needle valve or the orifice by adding a high-speed ON/OFF valve.

[Control Unit]

Figure 14:
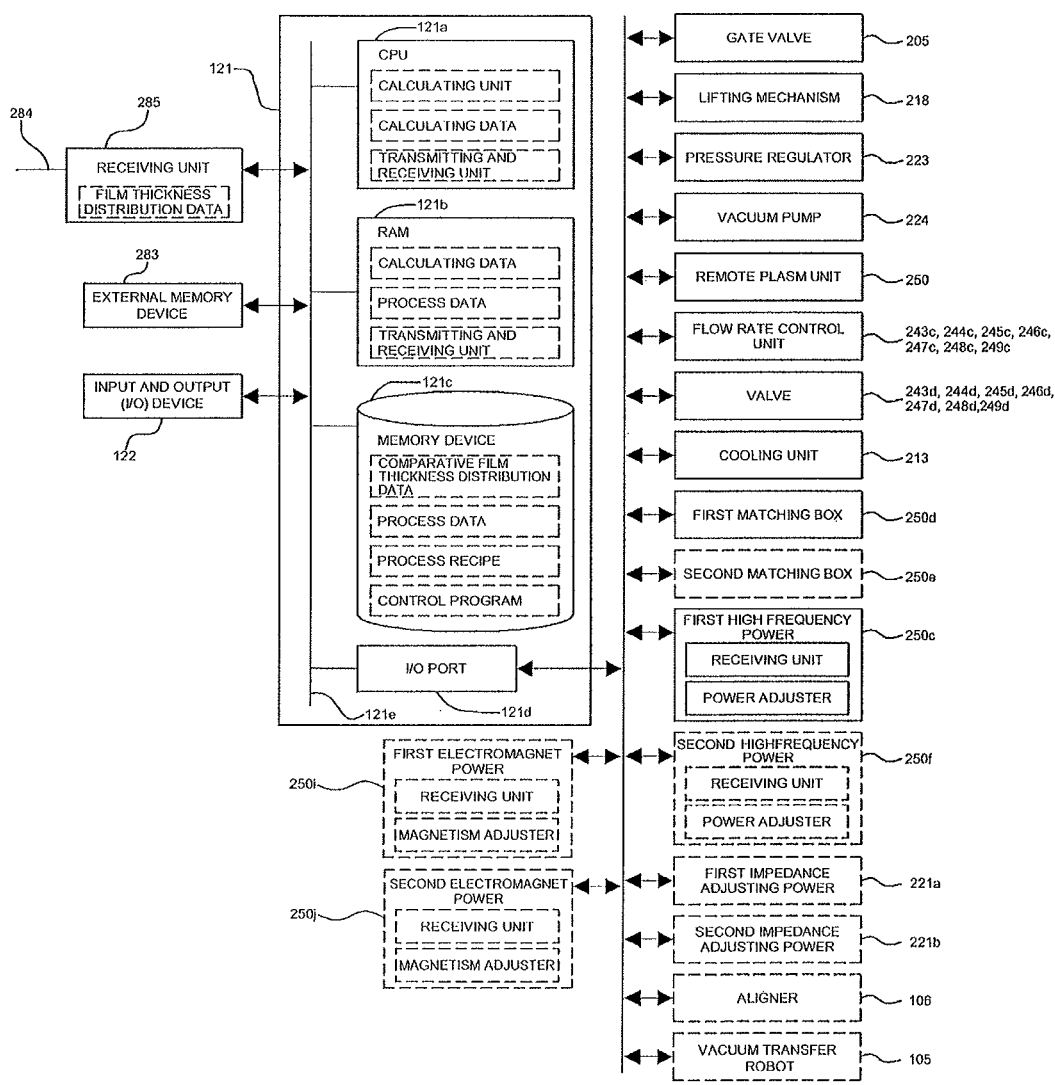
FIG. 14 is a diagram schematically illustrating a configuration of a controller according to an embodiment of the present invention.
Figure 15:
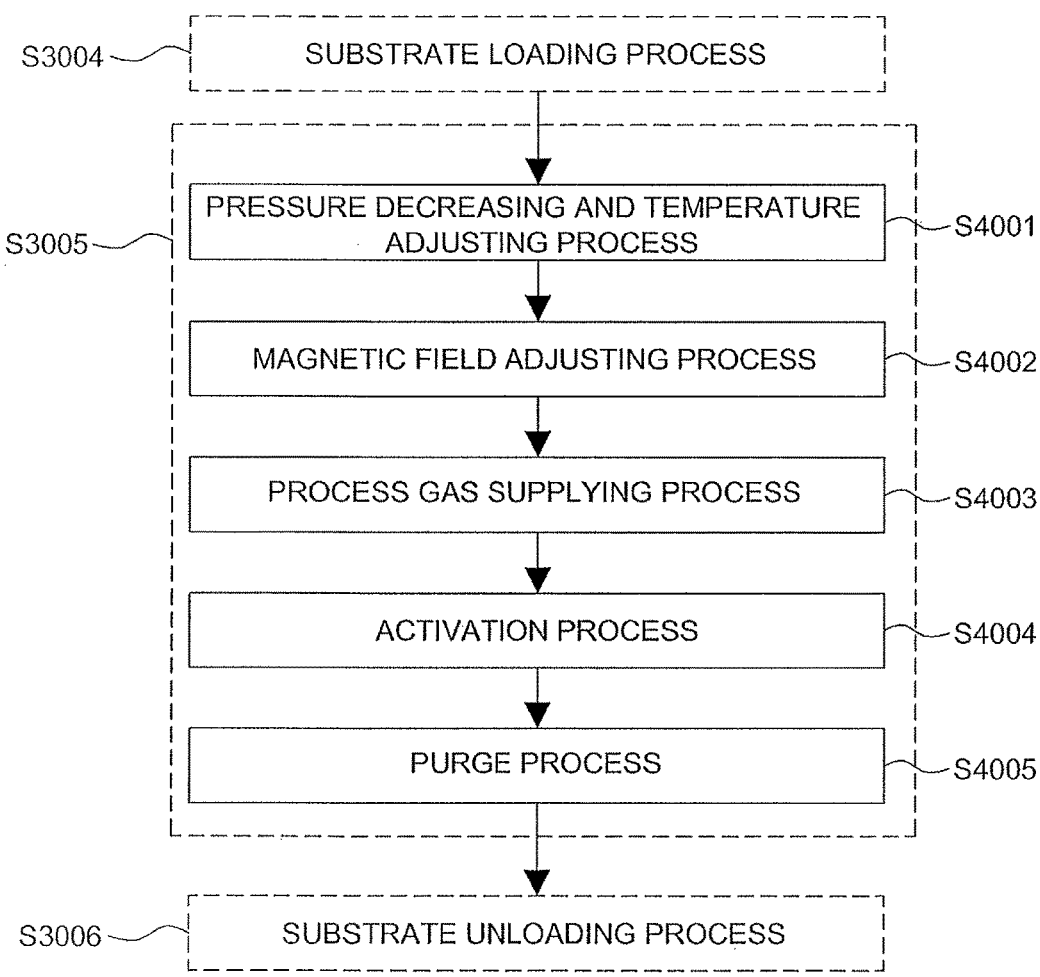
FIG. 15 is an explanatory diagram illustrating a substrate processing process according to an embodiment of the present invention.

As illustrated in FIG. 14, the substrate processing apparatus 100 includes a controller 121 that controls operations of the respective units of the substrate processing apparatus 100.

The controller 121 which is a control unit (control device) is configured as a computer that includes a central processing unit (CPU) 121a, a random access memory (RAM) 121b, a memory device 121c and an input-and-output (I/O) port 121d. The RAM 121b, the memory device 121 c and the I/O port 121 d are configured to exchange data with the CPU 121a through an internal bus 121e. An I/O device 122 configured as, for example, a touch panel or the like, an external memory device 283, a receiving unit 285 or the like is configured to be connected to the controller 121. Network 284 or the like is configured to be connected to the receiving unit 285.

The memory device 121 c is configured as, for example, a flash memory, a hard disk drive (HDD) or the like. A control program controlling the operations of the substrate processing apparatus, a process recipe describing sequences or conditions of substrate processing to be described below, comparative film thickness distribution data used in a calculation process of process data to the substrate 200, process data, and the like are readably stored in the memory device 121c. Also, the process recipe or the control program, which in a sequential combination causes the controller 121 to execute each sequence in the substrate processing process to be described below, in order to obtain a predetermined result and functions as a program. Hereinafter, such a process recipe, a control program and the like are collectively simply called a "program." Also, when the term "program" is used in this specification, it may refer to either the process recipe or the control program or both thereof. Also, the RAM 121b is configured as a memory area (work area) in which a program, calculation data, process data and the like read by the CPU 121a are temporarily stored.

The gate valve 205, the lifting mechanism 218, the pressure regulator 223, the vacuum pump 224, the RPU 250, the MFCs 243c, 244c, 245c, 246c, 247c, 248c and 249c, the valves 243d, 244d, 245d, 246d, 247d, 248d and 249d, the first matching box 250d, the second matching box 250e, the first high frequency power 250c, the second high frequency power 250f, the first impedance adjuster 220a, the second impedance adjuster 220b, the first impedance adjusting power 221a, the second impedance adjusting power 221b, the first electromagnet power 250i, the second electromagnet power 250j, the first heater power 213c, the second heater power 213d and the like are connected to the I/O port 121d.

The CPU 121 a serving as a calculation unit reads and executes the control program from the memory device 121c and reads the process recipe from the memory device 121c according to an input of a control command from the I/O device 122. Also, the film thickness distribution data input from the receiving unit 285 and the comparative film thickness distribution data stored in the memory device 121 c are compared and calculated to generate calculation data. Also, the determination process of process data (process recipe) corresponding to the calculating data or the like is performed. To comply with the contents of the read process recipe, the CPU 121a is configured to control an on-off operation of the gate valve 205, a lifting operation of the lifting mechanism 218, a pressure regulating operation by the pressure regulator 223, an on-off control of the vacuum pump 224, a gas excitement operation of the RPU 250, a flow rate regulating operation of the MFCs 243c, 244c, 245c, 246c, 247c, 248c and 249c, an on-off control of a gas of the valves 243d, 244d, 245d, 246d, 247d, 248d and 249d, a matching control of the first matching box 250d and the second matching box 250e, an on-off control of the first high frequency power 250c and the second high frequency power 250f, an impedance regulating operation by the first impedance adjuster 220a and the second impedance adjuster 220b, an on-off control of the first impedance adjusting power 221a and the second impedance adjusting power 221b, a power control for the first electromagnet power 250i of the second electromagnet power 250j, a power control for the first heater power 213c and the second heater power 213d and the like.

Also, the controller 121 is not limited to being configured as a dedicated computer, but may be configured as a general-purpose computer. For example, the controller 121 according to the present embodiment may be configured by preparing the external memory device 283 [e.g., a magnetic tape, a magnetic disk such as a flexible disk and a hard disk, an optical disc such as a CD or a DVD, a magneto-optical disc such as an MO and a semiconductor memory such as a USB memory and a memory card] recording the above-described program and then installing the program in the general-purpose computer using the external memory device 283. Also, a method of supplying the program to the computer is not limited to supplying through the external memory device 283. For example, a communication line such as the Internet or a dedicated line may be used to supply the program without the external memory device 283. Also, the memory device 121c or the external memory device 283 is configured as a non-transitory computer-readable recording medium. Hereinafter, these are also collectively simply called a recording medium. Also, when the term "recording medium" is used in this specification, it refers to either the memory device 121c or the external memory device 283 or both thereof.

Next, a method of forming a film using the substrate processing apparatus 100 will be described. After the film thickness measuring process (S104), the measured substrate 200 is loaded into the substrate processing apparatus 100. Also, in the following description, operations of the respective units constituting the substrate processing apparatus 100 are controlled by the controller 121.

[Substrate Loading Process (S3004)]

In the film thickness measuring process (S104), after the film thickness of the first poly-Si layer 200b is measured, the substrate 200 is loaded into the substrate processing apparatus 100. Specifically, the substrate support 210 is lowered by the lifting mechanism 218, and the lift pins 207 protrude from an upper surface of the substrate support 210 from the through holes 214. Also, after the pressure in the process chamber 201 is adjusted to a predetermined pressure, the gate valve 205 is opened and the substrate 200 is placed on the lift pins 207 from the gate valve 205. After the substrate 200 is placed on the lift pins 207, the substrate 200 is placed on the substrate support 210 from the lift pins 207 by lifting the substrate support 210 to a predetermined position by the lifting mechanism 218. Here, the predetermined pressure is, for example, a pressure when the pressure in the process chamber 201 is greater than or equal to a pressure in the vacuum transfer chamber 104.

[Pressure Decreasing and Temperature Adjusting Process (S4001)]

Next, the process chamber 201 is exhausted through the exhaust pipe 222 such that the pressure in the process chamber 201 becomes a predetermined pressure (a degree of vacuum). In this case, a degree of the valve opening of an APC valve serving as the pressure regulator 223 is feedback controlled based on a pressure value measured by a pressure sensor. Also, an amount of power supply to the heater 213 is feedback controlled based on a temperature value detected by a temperature sensor (not illustrated) such that a temperature in the process chamber 201 reaches a predetermined temperature. Specifically, the substrate support 210 is pre-heated by the heater 213 and remains for a predetermined time in a state in which the temperature of the substrate 200 or the substrate support 210 is not changed. During the time, when a gas is emitted from residual material or there is residual moisture in the process chamber 201, the gases may be removed by vacuum exhaustion or purging by supplying $N_2$ gas. In this manner, the preparation before a film forming process is completed. Also, when the process chamber 201 is exhausted such that the pressure therein becomes the predetermined pressure, the process chamber 201 may be vacuum-exhausted to a degree of vacuum that it can reach at once.

Also, here, the first heater 213a and the second heater 213b may be configured to tune their temperatures based on received data. When the temperature of the center portion of the substrate 200 is tuned to be different from that of the peripheral portion thereof, the process of the center portion of the substrate 200 may be different from that of the peripheral portion thereof.

[Magnetic Field Adjusting Process (S4002)]

Next, the first electromagnet power 250i and the second electromagnet power 250j supply predetermined power to the first electromagnet 250g and the second electromagnet 250h respectively so that a predetermined magnetic field is formed in the process chamber 201. For example, a magnetic field in a Z1 direction is formed. In this case, a magnetic field or magnetic flux density formed in an upper portion of the center portion of the substrate 200 or an upper portion of the peripheral portion thereof is tuned based on the received measurement data. The magnetic field or the magnetic flux density may be turned by a magnetic field strength generated from the first electromagnet 250g and a magnetic field strength generated from the second electromagnet 250h.

Here, when the electronic shield plate 250k is installed in the process chamber 201, a height of the electronic shield plate 250k may be turned. The magnetic field or the magnetic flux density may be turned by tuning the height of the electronic shield plate 250k.

Also, here, the first bias electrode 219a and the second bias electrode 219b may be configured to adjust the respective electric potential. For example, the first impedance adjuster 220a and the second impedance adjuster 220b are adjusted such that the electric potential of the first bias electrode 219a is lower than that of the second bias electrode 219b. When the electric potential of the first bias electrode 219a is lower than that of the second bias electrode 219b, an amount of the active species which flow onto the center portion of the substrate 200 may be greater than an amount of the active species which flow into the peripheral portion of the substrate 200, and the throughput of the center portion of the substrate 200 may be greater than that of the peripheral portion thereof.

[Process Gas Supply Process (S4003)]

Next, a silicon-element-containing gas serving as a first process gas is supplied into the process chamber 201 through the first process gas supply unit. Also, by continuing the gas exhausting from the process chamber 201 through the exhaust system, the pressure in the process chamber 201 reaches a predetermined pressure (a first pressure). Specifically, the valve 243d of the first process gas supply pipe 243a is opened, and the silicon-element-containing gas flows into the first process gas supply pipe 243a. The silicon-element-containing gas flows through the first process gas supply pipe 243a, and a flow rate thereof is adjusted by the MFC 243c. The silicon-element-containing gas of which the flow rate is adjusted is supplied into the process chamber 201 through the gas inlet 241a and is exhausted through the exhaust pipe 222. Also, in this case, the valve 246d of the first carrier gas supply pipe 246a is opened, and Ar gas may flow into the first carrier gas supply pipe 246a. The Ar gas flows through the first carrier gas supply pipe 246a, and a flow rate thereof is adjusted by the MFC 246c. The Ar gas of which the flow rate is adjusted is mixed with the silicon-element-containing gas in the first process gas supply pipe 243a to be supplied into the process chamber 201 through the gas inlet 241a and is exhausted through the exhaust pipe 222.

[Activation Process (S4004)]

Next, high frequency power is supplied from the first high frequency power 250c to the first coil 250a through the first matching box 250d, and the silicon-element-containing gas present in the process chamber 201 is activated. In this case, specifically, silicon-element-containing plasma is generated in the first plasma generating region 251, and the activated silicon-element-containing gas is supplied onto the substrate 200. Preferably, it is configured such that different concentrations of active species are supplied onto the center portion of the substrate 200 and the peripheral portion thereof. For example, when a size of a magnetic field formed by the second electromagnet 250h is greater than a size of a magnetic field formed by the first electromagnet 250g, the plasma density in the fourth plasma generating region 254 may be greater than the plasma density in the third plasma generating region 253. In this case, in the substrate 200, activated plasma may be generated in the upper portion of the peripheral portion of the substrate 200 as opposed the upper portion of the center portion of the substrate 200.

In this manner, a state in which the silicon-element-containing plasma is generated is retained for a predetermined time, and a predetermined process is performed.

Also, it is configured such that the concentration of active species in the center portion is different from the concentration of active species in the peripheral portion by an electric potential difference between the first bias electrode 219a and the second bias electrode 219b.

Also, in this case, high frequency power is supplied from the second high frequency power 250f to the second coil 250b through the second matching box 250e, and silicon-element-containing plasma may be generated in the second plasma generating region 252.

[Purge Process (S4005)]

In a state in which the silicon-element-containing plasma is generated, after a predetermined time has elapsed, the high frequency power is turned off and the plasma disappears. In this case, the supply of the silicon-element-containing gas serving as a process gas may be stopped, or the supply may continue for a predetermined time. After the supply of the silicon-element-containing gas is stopped, the gas remaining in the process chamber 201 is exhausted through the exhaust unit. In this case, it is configured such that an inert gas is supplied into the process chamber 201 through the inert gas supply unit to extrude the remaining gas. In such a configuration, the duration of the purge process may be reduced, and the throughput may be improved.

[Substrate Unloading Process (S3006)]

After the purge process (S4005) is performed, a substrate unloading process (S3006) is performed and the substrate 200 is unloaded from the process chamber 201. Specifically, the process chamber 201 is purged with an inert gas, and the pressure therein is adjusted to transfer the inert gas. After the adjustment of the pressure, the substrate support 210 is lowered by the lifting mechanism 218, the lift pins 207 protrude from the through holes 214, and the substrate 200 is placed onto the lift pins 207. After the substrate 200 is placed onto the lift pins 207, the gate valve 205 is opened and the substrate 200 is unloaded from the process chamber 201.

Next, a method of controlling a film thickness of the second silicon-containing layer using the present apparatus will be described. As described above, after the CMP process (S103) is completed, the film thickness of the first poly-Si layer 2005 in the center portion of the substrate 200 is different from the film thickness of the first poly-Si layer 2005 in the peripheral portion thereof. In the film thickness measuring process (S104), a distribution of the film thickness is measured. The measured result is stored in the RAM 121b through an upper apparatus (not illustrated). Stored data is compared to a recipe in the memory device 121c, and predetermined process data is calculated by the CPU 121a. The apparatus is controlled based on the process data.

Next, the case in which the data stored in the RAM 121b is a distribution A will be described. The case of the distribution A refers to the case in which the poly-Si layer 2005a has a greater thickness than that of the poly-Si layer 2005b as illustrated in FIG. 7.

Figure 20:
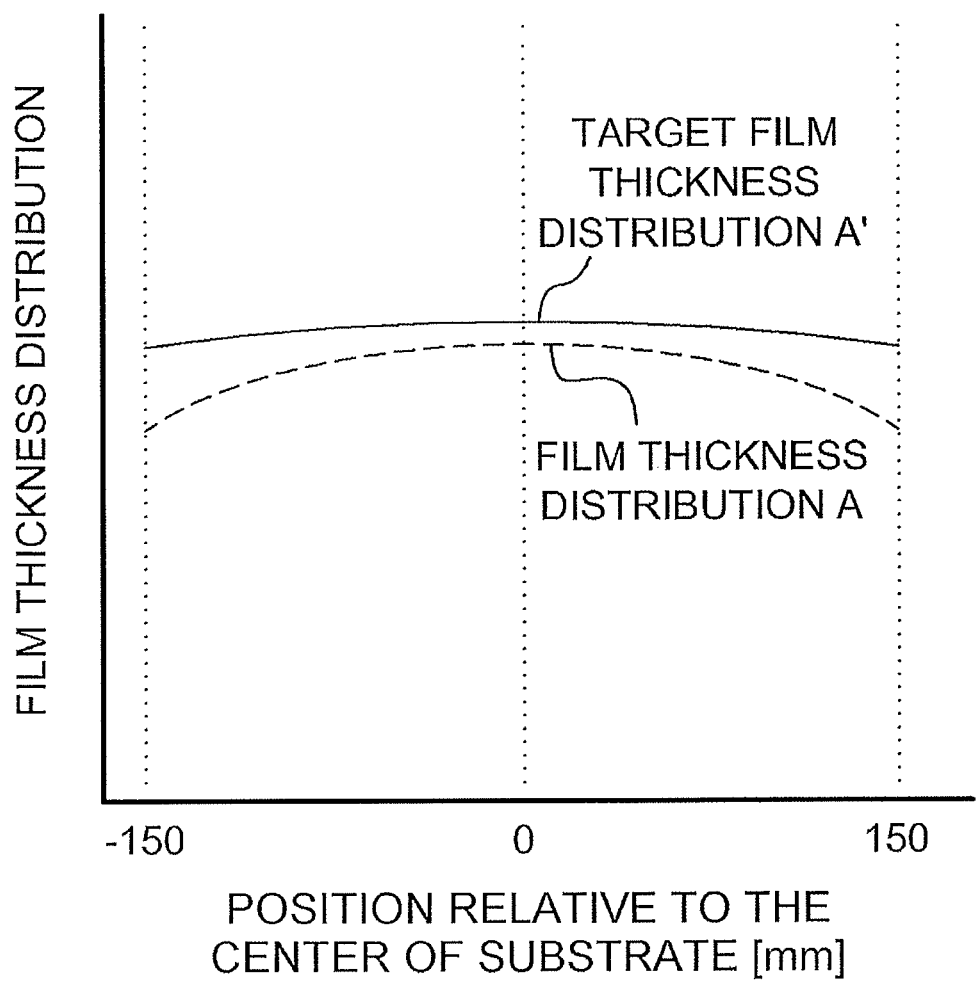
FIG. 20 is a graph for describing a film thickness distribution of a substrate according to an embodiment of the present invention.

In the present process, thickness is controlled such that the film thickness of the second poly-Si layer on the peripheral portion of the substrate 200 is increased and the film thickness of the second poly-Si layer on the center portion of the substrate 200 is decreased, such that a target film thickness distribution A' compensates for the distribution A as illustrated in FIG. 20. For example, when the strength of the magnetic field generated from the second electromagnet 250h is greater than the strength of the magnetic field generated from the first electromagnet 250g, the plasma density in the fourth plasma generating region 254 may be greater than the plasma density in the third plasma generating region 253, and activated plasma may be generated on the upper portion of the peripheral portion of the substrate 200 compared to the upper portion of the center portion of the substrate 200. The film thickness of the peripheral portion of the substrate 200 may be increased by processing it under the generated plasma.

In this case, the thickness of the poly-Si layer 2006 is controlled such that the thickness of the poly-Si layer 2005b on which the poly-Si layer 2006b is stacked is substantially the same as the thickness of the poly-Si layer 2005a on which the poly-Si layer 2006a is stacked. Preferably, it should be controlled such that a distance from the surface of the substrate to an upper end of the second silicon-containing layer is within a predetermined range. Also, more preferably, the film thickness distribution of the second silicon-containing layer is controlled such that a distribution of the height of the second silicon-containing layer (the upper end of the second silicon-containing layer) in the surface of the substrate is within a predetermined range.

Also, as another method, the electric potential of the first bias electrode 219a and the electric potential of the second bias electrode 219b may be individually controlled. For example, when the electric potential of the second bias electrode 219b is lower than the electric potential of the first bias electrode 219a, an amount of the active species which flow onto the peripheral portion of the substrate 200 is increased, and thus the film thickness of the peripheral portion of the substrate 200 may be increased.

Also, power supplied to the first coil 250a and power supplied to the second coil 250b may be individually controlled. For example, when the power supplied to the second coil 250b is greater than the power supplied to the first coil 250a, an amount of the active species supplied onto the peripheral portion of the substrate 200 is increased, and thus the film thickness of the peripheral portion of the substrate 200 may be increased.

Also, a more careful control is possible by performing a plurality of controls in parallel.

Figure 21:
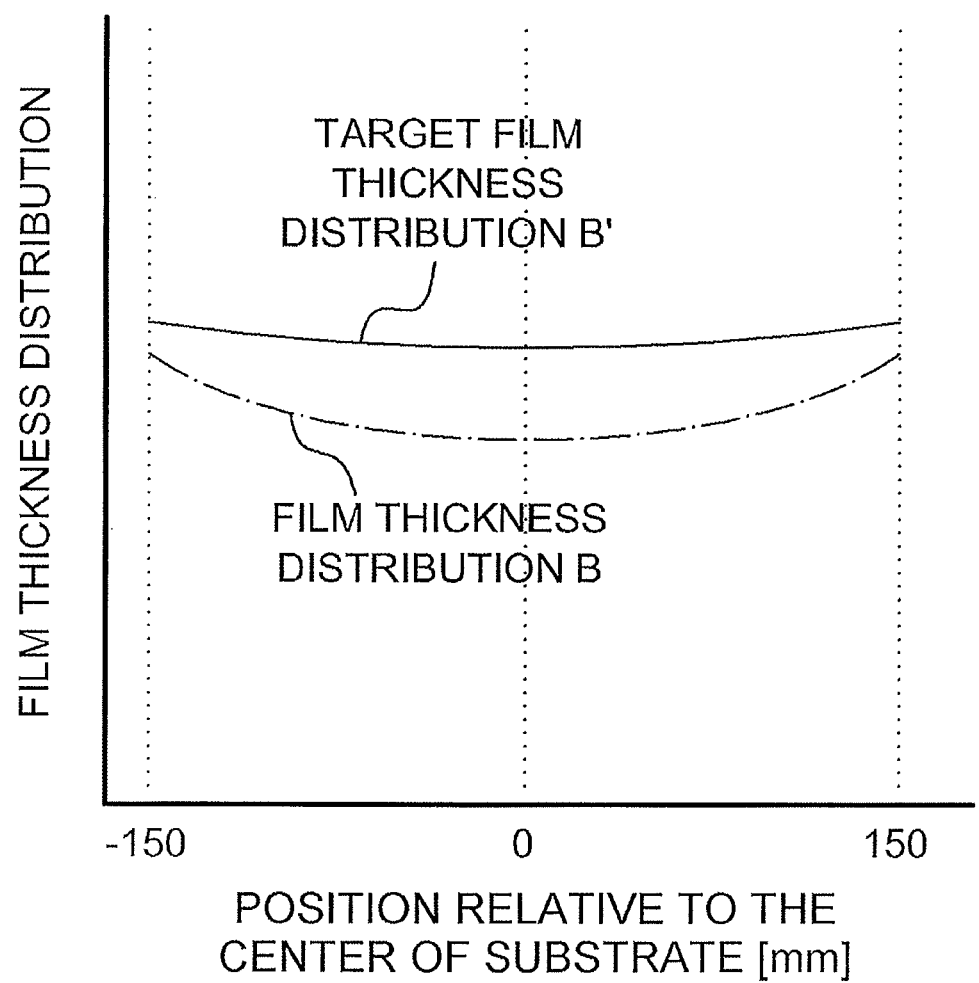
FIG. 21 is a graph for describing a film thickness distribution of a substrate according to an embodiment of the present invention.

In the present process, the thickness is controlled such that the film thickness of the second poly-Si layer on the center portion of the substrate 200 is increased and the film thickness of the second poly-Si layer on the peripheral portion of the substrate 200 is decreased, such that a target film thickness distribution B' compensates for the distribution B as illustrated in FIG. 21. For example, the generation of the plasma in the third plasma generating region 253 may be controlled by controlling the magnetic field formed by the first electromagnet 250g and the magnetic field formed by the second electromagnet 250h.

In this case, the thickness of the poly-Si layer 2006 is controlled such that the thickness of the poly-Si layer 2005b on which the poly-Si layer 2006b is stacked is the same as the thickness of the poly-Si layer 2005a on which the poly-Si layer 2006a is stacked.

Also, as another method, the electric potential of the first bias electrode 219a and the electric potential of the second bias electrode 219b may be individually controlled. For example, when the electric potential of the first bias electrode 219a is lower than the electric potential of the second bias electrode 219b, an amount of the active species which flow into the center portion of the substrate 200 is increased, and thus the film thickness of the center portion of the substrate 200 may be increased.

Also, the power supplied to the first coil 250a and the power supplied to the second coil 250b may be individually controlled. For example, when the power supplied to the first coil 250a is greater than the power supplied to the second coil 250b, an amount of the active species supplied onto the center portion of the substrate 200 is increased, and thus the film thickness of the center portion of the substrate 200 may be increased.

A more careful control is possible by performing a plurality of controls in parallel.

[Film Thickness Measuring Process (S106)]

Next, a film thickness measuring process (S106) will be described. In the film thickness measuring process (S106), a height of a layer on which the first poly-Si layer and the second poly-Si layer are stacked is measured, and it is determined whether or not the height of the stacked layer is aligned. That is, whether or not the film thickness of the poly-Si layer compensates is determined. Here, "the height is aligned" is not limited to the case in which the height is completely aligned, and there may be a difference in the height. For example, the difference in the height may be within a range that does not influence the subsequent exposure process or etching process. When the distribution of the height in the surface of the substrate 200 is within a predetermined range, a nitride film forming process (S107) is performed. Also, when it is already known that the film thickness distribution is within the predetermined range, the film thickness measuring process (S106) may be omitted.

[Nitride Film Forming Process (S107)]

Next, a nitride film forming process (S107) will be described. After the second silicon-containing layer forming process (S105) or the film thickness measuring process (S106), the substrate 200 is loaded into a nitride film forming device 100d. Since the nitride film forming device 100d is a general single substrate processing apparatus, description thereof is omitted.

Figures 17A, 17B:
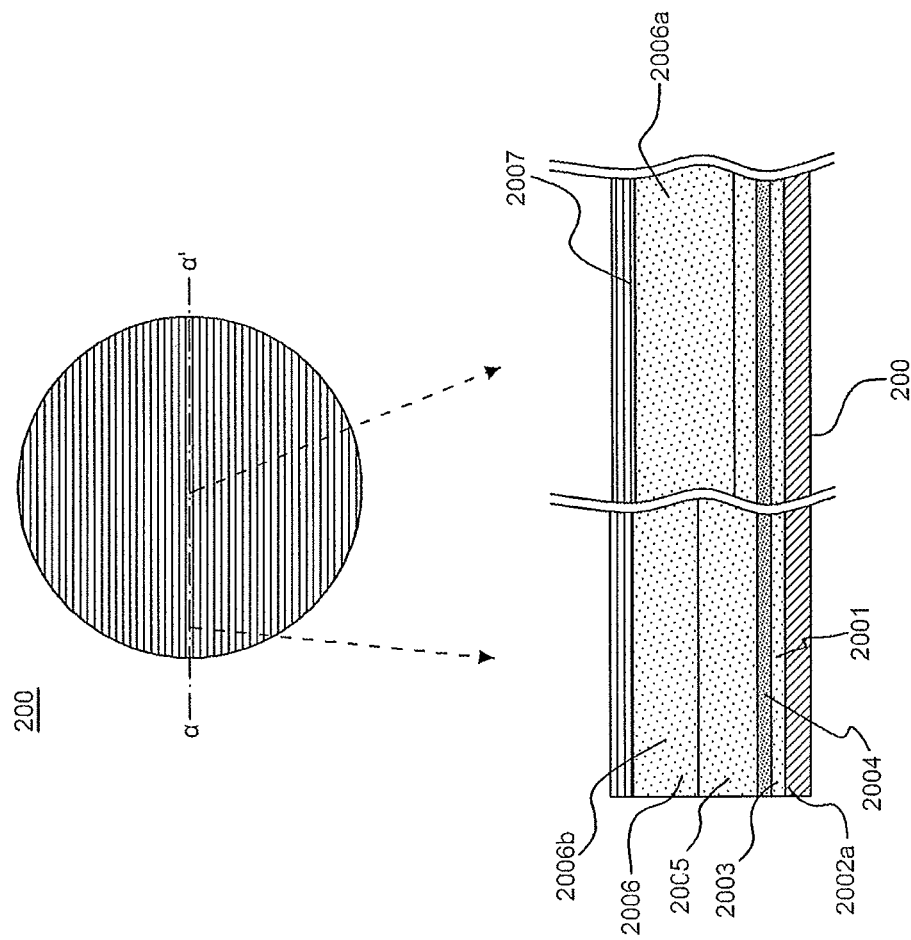
FIG. 17A and 17B are explanatory diagrams illustrating a processing state of a substrate according to an embodiment of the present invention.

In the present process, a silicon nitride film 2007 is formed on the second poly-Si layer 2006 as illustrated in FIG. 17B. The silicon nitride film serves as a hard mask in an etching process to be described below. Also, the distribution A is described as an example in FIG. 17B, but is not limited thereto. Needless to say that it is the same in the case of distribution B.

In the nitride film forming apparatus 100d, a silicon-containing gas and a nitrogen-containing gas are supplied into the process chamber 201 to form the silicon nitride film 2007 on the substrate 200. The silicon-containing gas is, for example, disilane ($Si_2H_6$) gas and the nitrogen-containing gas is, for example, ammonia ($NH_3$) gas.

Since the silicon nitride film 2007 is formed on the poly-Si film of which the height is aligned in the second poly-Si layer forming process, the height of the silicon nitride film also has a height distribution within a predetermined range in the surface of the substrate. That is, a distance from the concave structure surface 2002a to a surface of the nitride film 2007 in the surface of the substrate 200 is within a predetermined range in the surface of the substrate 200.

[Film Thickness Measuring Process (S108)]

Next, a film thickness measuring process (S108) will be described. In the film thickness measuring process (S108), a height of a layer on which the first poly-Si layer, the second poly-Si layer and the silicon nitride film are stacked is measured. When the height is within a predetermined range, a patterning process (S109) is performed. Here, "the height is within a predetermined range" is not limited to the case in which the height is completely aligned, and there may be a difference in the height. For example, the difference in the height may be within a range that does not influence the subsequent exposure process or etching process. Also, when it is already known that the height of the layer on which the first poly-Si layer, the second poly-Si layer and the silicon nitride film are stacked is a predetermined value, the film thickness measuring process (S108) may be omitted.

[Patterning Process (S106)]

Figure 18A:
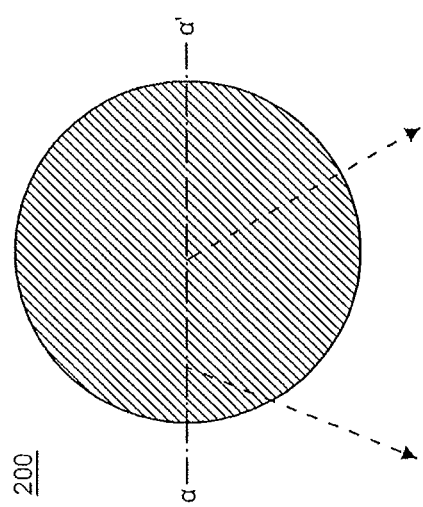
FIG. 18A and 18B are explanatory diagrams illustrating a processing state of a substrate according to an embodiment of the present invention.
Figure 18B:
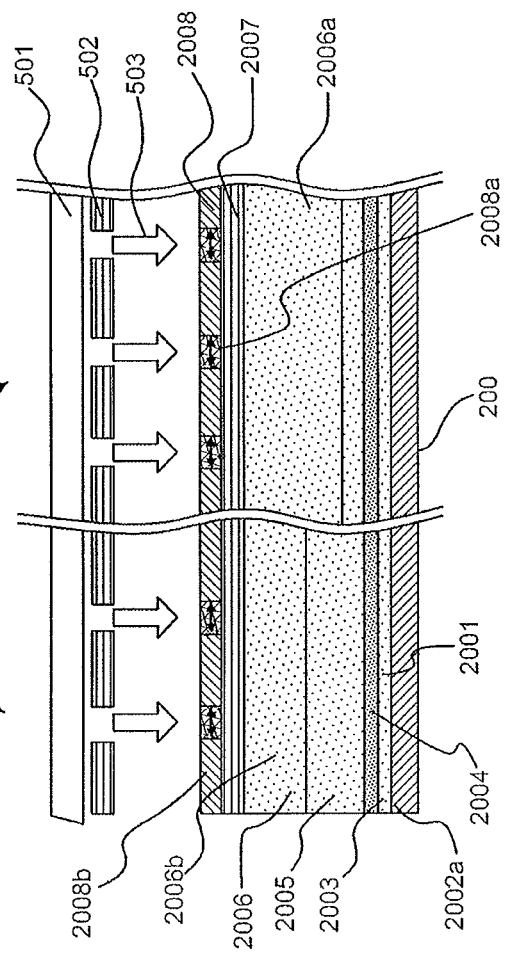
Figures 19A, 19B:
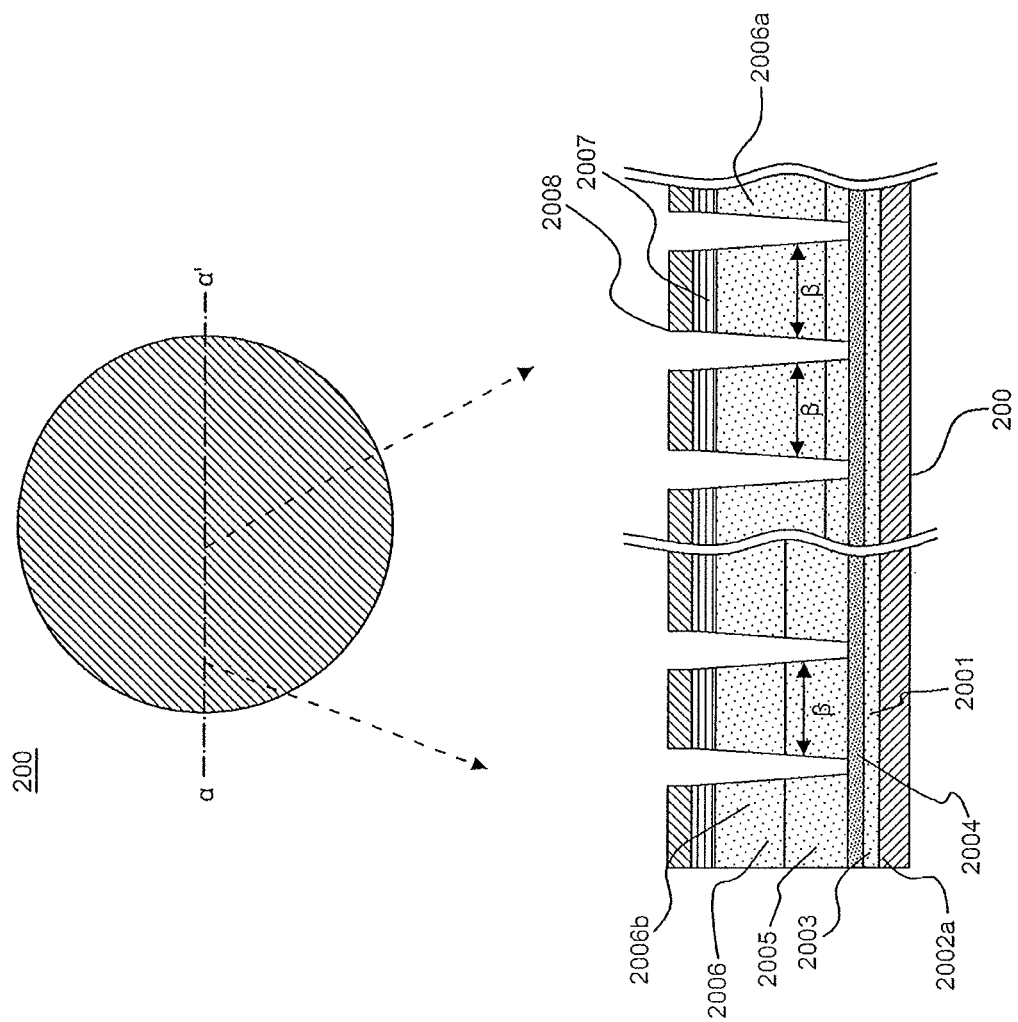
FIG. 19A and 19B are explanatory diagrams illustrating a processing state of a substrate according to an embodiment of the present invention.

Next, a patterning process (S106) will be described with reference to FIGS. 18A, 18B, 19A and 19B. FIG. 18A and 18B are explanatory diagrams illustrating the substrate 200 in an exposure process. FIG. 19A and 19B are explanatory diagrams illustrating the substrate 200 after an etching process.

Hereinafter, detailed description thereof will be described. After the silicon nitride film is formed, the silicon nitride film is covered with a resist film 2008. Then, a lamp 501 emits light and an exposure process is performed. In the exposure process, light 503 is emitted onto the resist film 2008 through the mask 502 to modify a portion of the resist film 2008. Here, the modified resist film is referred to as a resist film 2008a and the unmodified resist film is referred to as a resist film 2008b.

As described above, a height from the concave structure surface 2002a to the surface of the nitride film 2007 is within the predetermined range in the surface of the substrate 200. Therefore, the height from the concave structure surface 2002a to a surface of the resist film 2008 may be aligned. In the exposure process, a distance in which light travels to reach the resist film, that is, the travel of the light 503, is equal in the surface of the substrate 200. Therefore, it is possible to equalize the in-surface distribution of the depth of focus.

Since the depth of focus is equalized, a width of the resist film 2008a may be constant in the surface of the substrate as illustrated in 18B. Therefore, it is possible to remove the deviation of the pattern width.

Next, the state of the substrate 200 after the etching process will be described with reference to FIGS. 19A and 19B. As described above, since the width of the resist film 2008a is constant, it is possible to make a constant etching condition in the surface of the substrate 200. Therefore, in the center portion of the substrate 200 or the peripheral portion thereof, an etching gas is uniformly supplied and thus it is possible to constantly make the width $\beta$ of the poly-Si layer (hereinafter referred to as a filler) after the etching process. Since the width $\beta$ is constant in the surface of the substrate 200, it is possible to constantly make the characteristic of the gate electrode in the surface of the substrate, thus improving the yield.

Next, comparative examples will be described with reference to FIGS. 22A, 22B, 23A and 23B. In the comparative examples, the second silicon-containing layer forming process (S105) is not performed. Therefore, the height at the center portion of the substrate 200 is different from that at the peripheral portion thereof.

Figures 22A, 22B:
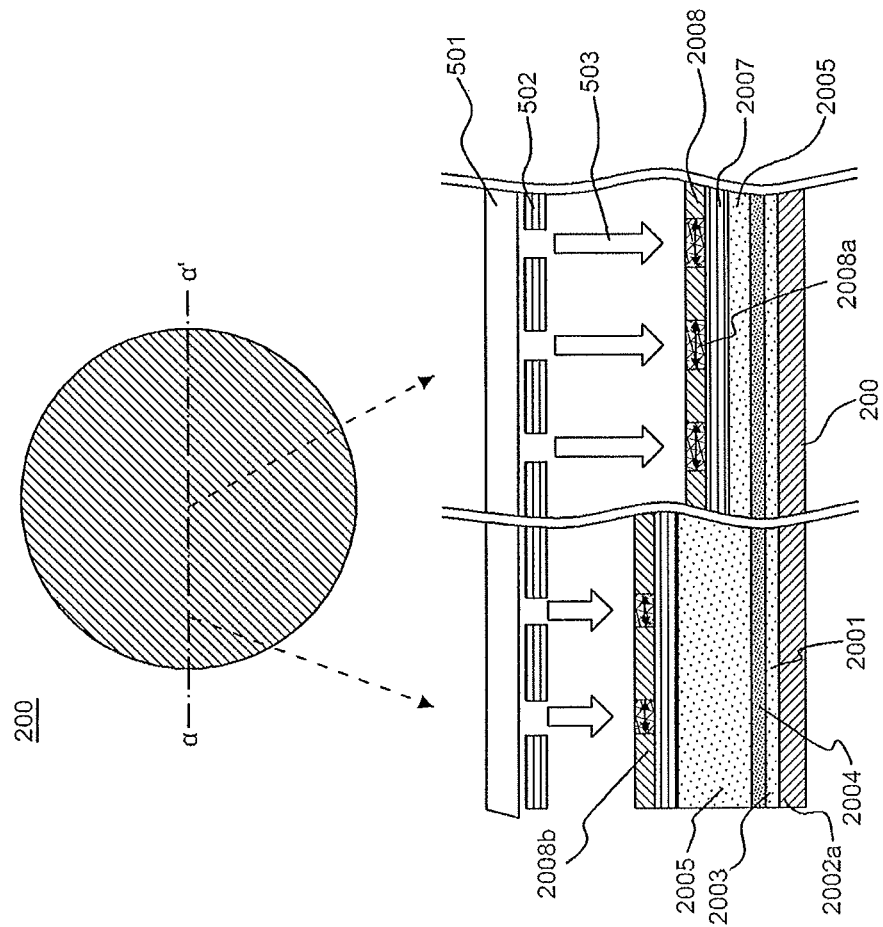
FIG. 22A and 22B are explanatory diagrams illustrating a processing state of a substrate according to a comparative example.

First, a first comparative example will be described with reference to FIGS. 22A and 22B. FIGS. 22A and 22B are views in comparison with FIGS. 18A and 18B. In FIG. 22B, since the height of the poly-Si layer at the center portion of the substrate 200 is different from that at the peripheral portion thereof, the distance the light travels to reach 503 at the center portion of the substrate 200 is different from that for reaching the peripheral portion of the substrate 200. Therefore, the focal length at the center portion is different from at the peripheral portion, and as a result, the width of the resist film 2008a is changed in the surface of the substrate. When the process is performed using the resist film 2008, the width of the filler after the etching process is changed, and thus a variation occurs in the characteristics.

On the other hand, in the present embodiment, since the second silicon-containing layer forming process (S105) is performed, the width of the filler may be constant in the surface of the substrate 200. Therefore, the semiconductor device having uniform characteristics is formed compared to the comparative example, and thus it may significantly contribute to improve the yield.

Figures 23A, 23B:
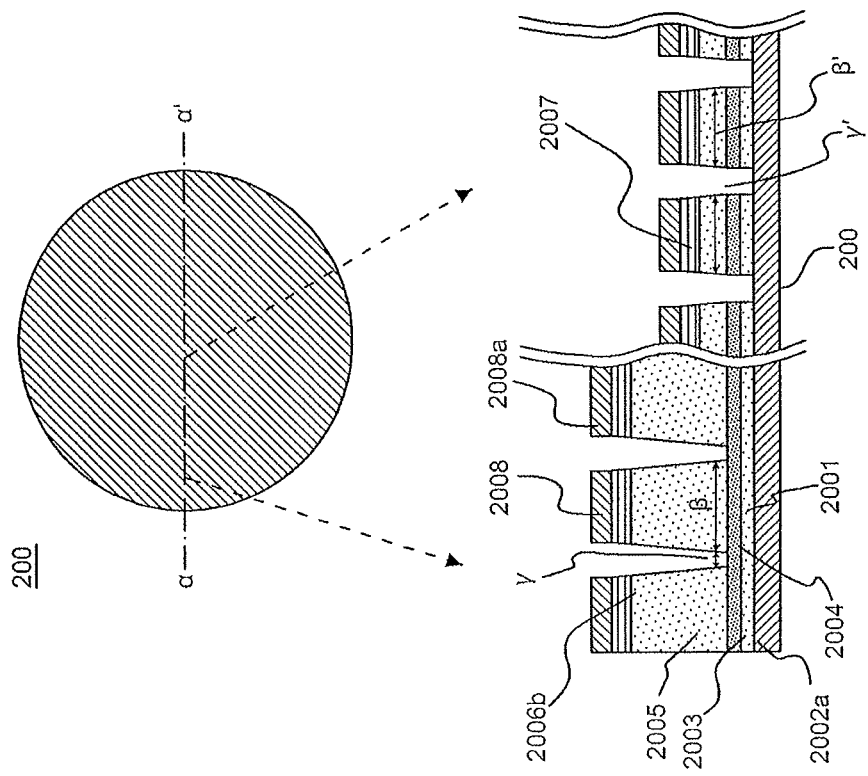
FIG. 23A and 23B are explanatory diagrams illustrating a processing state of a substrate according to a comparative example.

Next, a second comparative example will be described with reference to FIGS. 23A and 23B. FIGS. 23A and 23B are views in comparison with FIGS. 19A and 19B. FIGS. 23A and 23B are explanatory diagrams, for example, in the case in which there is no variation of the width of the resist film 2008a at the center portion of the substrate 200 and the peripheral portion of the substrate 200. That is, it refers to a case in which there is no variation in a width of an opening between the resist films 2008a [a place where the resist film 2008a is removed].

After the resist film 2008b is removed, an etching process is performed. In the etching process, the poly-Si film is removed, and thus the height of the poly-Si film at the center portion of the substrate 200 is different from at the peripheral portion of the substrate 200. Therefore, for example, when etching time is set according to an etching requirement for the height of the center portion, a desired amount of the poly-Si film may be etched in the center portion, but residual material remains for etching in the peripheral portion. Meanwhile, when the center portion is etched according to an etching requirement for the height of the peripheral portion, a desired amount of the poly-Si film may be etched in the peripheral portion, but a side wall of the filler, the gate insulating film 2004, and the device isolation film 2003 are etched in the center portion.

When the side wall of the filler is etched, a distance $\gamma$ between the poly-Si films of the filler at the center portion of the substrate 200 is different from that at the peripheral portion thereof. That is, a width $\beta$ of the poly-Si film of the filler at the center portion of the substrate 200 is different from that at the peripheral portion thereof.

Since the characteristics of the electrode are likely to be affected by the width $\beta$, the deviation also occurs in the characteristics of the formed electrode when the variation in the width $\beta$ occurs. Therefore, the deviation in the width $\beta$ results in reduction of the yield.

Therefore, in the present embodiment, it is possible to align the width of the filler at the center portion of the substrate 200 and the peripheral portion thereof by aligning the height of the poly-Si film. Therefore, the yield may be improved.

Other Embodiments

Figure 16:
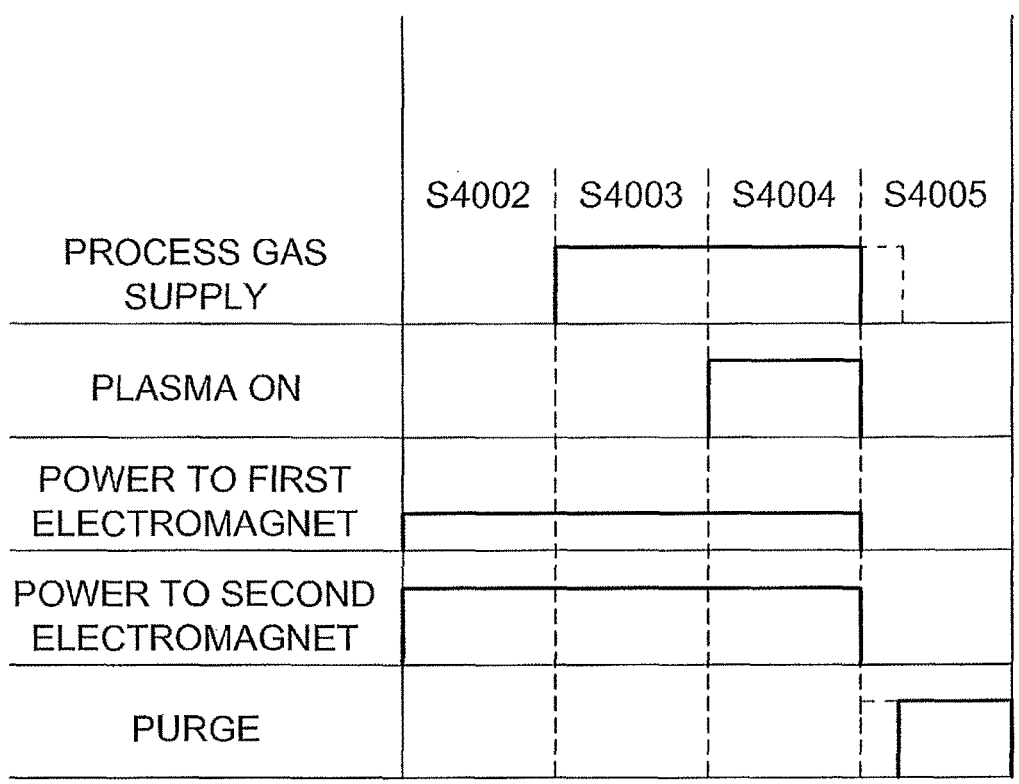
FIG. 16 is an example of a substrate processing sequence according to an embodiment of the present invention.

The present invention is not limited to be a processing sequence example in which an amount of the film formed on the center portion of the substrate 200 is different from an amount of the film formed on the peripheral portion thereof, as illustrated in FIG. 16, as there are the following processing sequence examples.

Figure 24:
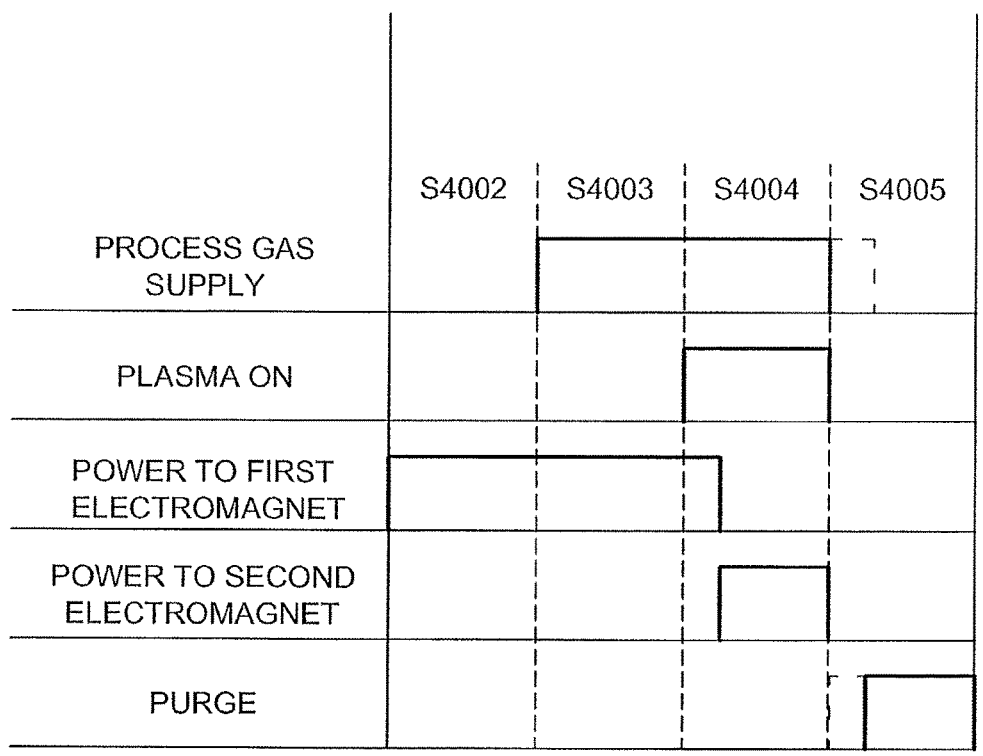
FIG. 24 is an example of a substrate processing sequence according to another embodiment of the present invention.

For example, there is a processing sequence example as illustrated in FIG. 24. FIG. 24 illustrates a processing example in which a magnetic field is generated by the second electromagnet 250h after a magnetic field is generated by the first electromagnet 250g. By processing in this manner, the amount of film formed on the peripheral portion of the substrate 200 may be greater than the amount of film formed on the center portion thereof. On the other hand, when the magnetic field is generated by the first electromagnet 250g after the magnetic field is generated by the second electromagnet 250h, the amount of film formed on the center portion of the substrate 200 may be greater than the amount of film formed on the peripheral portion thereof.

Figure 25:
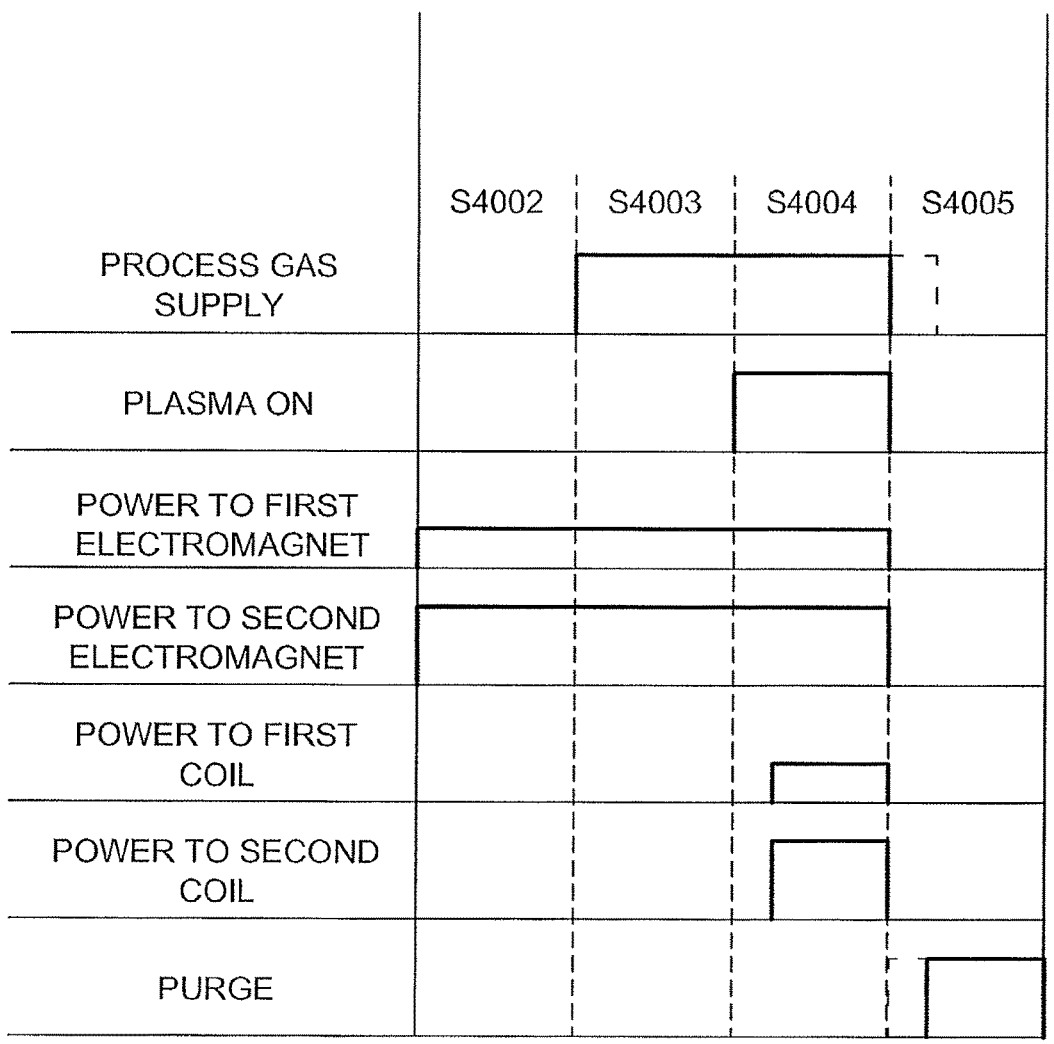
FIG. 25 is an example of a substrate processing sequence according to still another embodiment of the present invention.

Also, there is a processing sequence example as illustrated in FIG. 25. FIG. 25 illustrates a processing example in which power supplied to the second coil 250b is greater than power supplied to the first coil 250a. By processing in this manner, the amount film formed on the peripheral portion of the substrate 200 may be greater than the amount of film formed on the center portion thereof On the other hand, when the power supplied to the first electromagnet 250g is greater than the power supplied to the second electromagnet 250h and the power supplied to the first coil 250a is greater than the power supplied to the second coil 250b, the amount of film formed on the center portion of the substrate 200 may be greater than the amount of film formed on the peripheral portion thereof.

Figure 26:
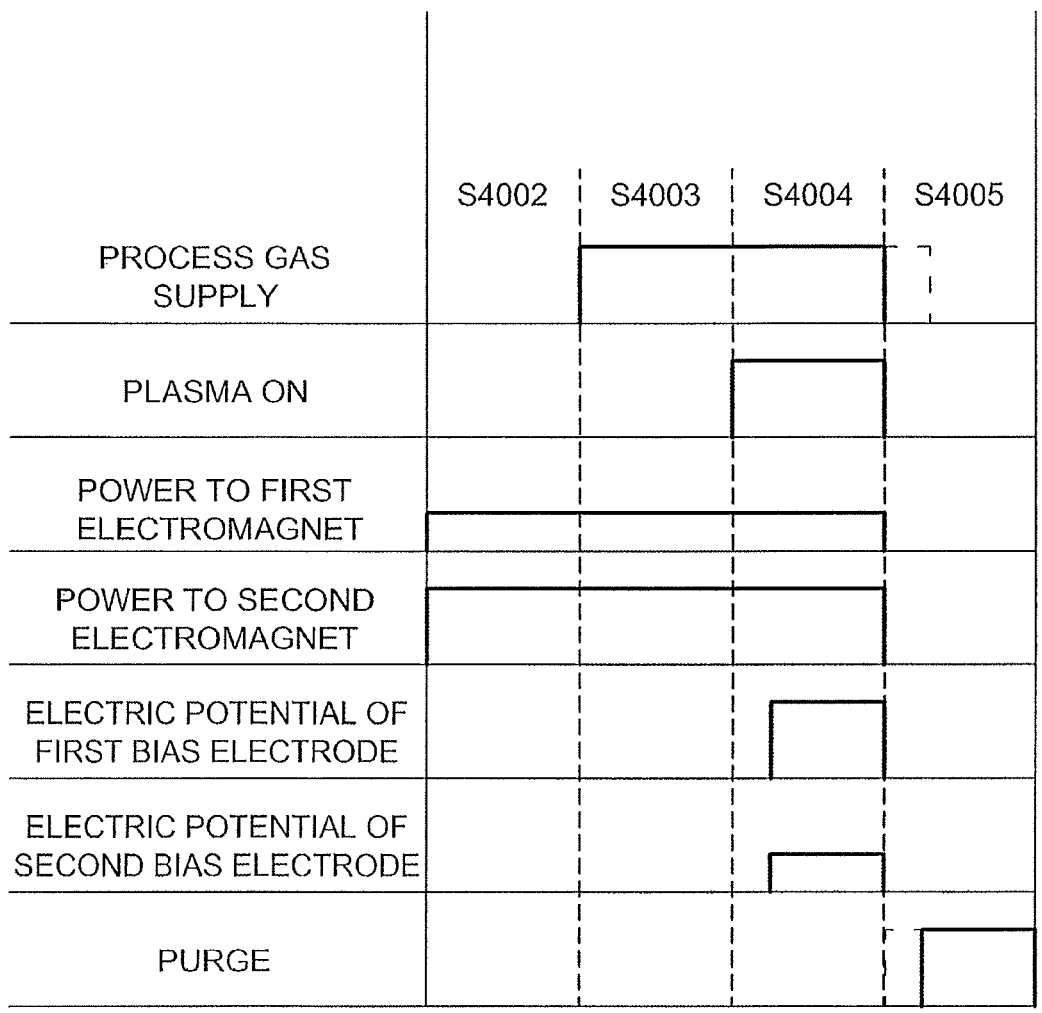
FIG. 26 is an example of a substrate processing sequence according to yet another embodiment of the present invention.

Also, there is a processing sequence example as illustrated in FIG. 26. FIG. 26 illustrates a processing example in which an electric potential of the first bias electrode 219a is greater than an electric potential of the second bias electrode 219b. By processing in this manner, the amount of film formed on the peripheral portion of the substrate 200 may be greater than the amount of film formed on the center portion thereof. On the other hand, when the power supplied to the first electromagnet 250g is greater than the power supplied to the second electromagnet 250h and the electric potential of the second bias electrode 219b is greater than the electric potential of the first bias electrode 219a, the amount of film formed on the center portion of the substrate 200 may be greater than the amount of film formed on the peripheral portion thereof.

Also, although it is described above that the plasma is generated in the process chamber 201 using the first coil 250a, the first electromagnet 250g and the second electromagnet 250h, the plasma generation method is not limited thereto. For example, the plasma may be generated in the process chamber 201 using the second coil 250b, the first electromagnet 250g and the second electromagnet 250h. Although the plasma in the case of using only the second coil 250b is mainly generated in the second plasma generating region 252, the active species generated in the second plasma generating region is caused to diffuse to the center portion of the substrate 200 by using either the first electromagnet 250g or the second electromagnet 250h or both thereof, and thus be adjustable for the processing distribution.

Also, although it is described above that the center portion of the substrate 200 and the peripheral portion thereof are divided, but the present invention is not limited thereto. The film thickness of the silicon-containing film may be controlled by defining finer division of the regions along the radial direction. For example, it may be divided into three regions such as the center portion of the substrate 200, the peripheral portion thereof, and a portion between the center portion and the peripheral portion.

Also, although it is described above that the diameter of the first electromagnet 250g is the same as the diameter of the second electromagnet 250h, but the present invention is not limited thereto. For example, the diameter of the second electromagnet 250h may be greater than the diameter of the first electromagnet 250g, and the diameter of the first electromagnet 250g may be greater than the diameter of the second electromagnet 250h.

Also, although the silicon nitride film serving as a hard mask is described above as an example here, but the present invention is not limited thereto. For example, the silicon oxide film may be used.

Also, the present invention is not limited to the silicon oxide film or the silicon nitride film, and the pattern may be formed of an oxide film, a nitride film, a carbide film, an oxynitride film, a metal film or a combination thereof, each of which contains different elements.

Also, although it is described above that the first silicon-containing layer forming device 100a, the CMP apparatus 100b, the measuring apparatus 100c and the nitride film forming device 100d are configured in the same processing system 4000, but the present invention is not limited thereto. For example, a system including each of the first silicon-containing layer forming device 100a, the CMP device 100b, the measuring apparatus 100c and the nitride film forming device 100d may be configured, and the processing system 400 including a combination of two or more components may be configured.

Also, although the substrate 200 of 300 mm is described above as an example, but the present invention is not limited thereto. For example, when the substrate 200 of 450 mm or more is used, the resulting effects are increased. In the case of a large substrate, the effects of the polishing process (S103) are significantly increased. That is, the difference between the film thicknesses of the poly-Si layer 2005a and the poly-Si layer 2005b is further increased. Also, the effects of the in-surface film quality distribution of the first poly-Si layer formed in the first silicon-containing layer forming process (S102) on the polishing process (S103) is increased, a challenge in which the difference between the film thicknesses is further increased occurs. The challenge may be resolved by optimizing the condition of each of the first silicon-containing layer forming process (S102) and the polishing process (S103). However, it takes much time and high cost for the optimization of the condition or the optimization of the condition that do not affect the operations. On the other hand, when the compensation process is performed as described above, the film compensates without the optimization of the condition of each of the first silicon-containing layer forming process (S102) or the polishing process (S103).

Also, although one process of the processes of manufacturing the semiconductor device is described above, but the process is not limited thereto. A backend processes including similar process may be used. Also, it may be applied to a technique for processing the substrate such as a patterning process in a liquid crystal panel manufacturing process, a patterning process in a solar cell manufacturing process, a patterning process in a power device manufacturing process or the like.

According to the technique in accordance with the present invention, it is possible to suppress the deviation of the characteristics of semiconductor device.

Preferred Embodiments of the Present Invention

Hereinafter, preferred embodiments according to the present invention are supplementarily noted.

<Supplementary Note 1>

According to an aspect of the present disclosure, there is provided a method of manufacturing a semiconductor device or a substrate processing method, the method including:

(a) receiving data representing a thickness distribution of a polished silicon-containing layer on a substrate including a convex structure whereon the polished silicon-containing layer is formed;

(b) calculating, based on the data, a process data for reducing a difference between a thickness of a portion of the polished silicon-containing layer formed at a center portion of the substrate and that of the polished silicon-containing layer formed at a peripheral portion of the substrate;

(c) loading the substrate into a process chamber;

(d) supplying a process gas to the substrate; and (e) compensating for the difference based on the process data by activating the process gas with a magnetic field having a predetermined strength on the substrate.

<Supplementary Note 2>

In the method of Supplementary note 1, preferably, a strength of the magnetic field generated at a side of the substrate is adjusted to be greater than that of the magnetic field generated above the substrate in the step (e) when the data indicates the portion of the polished silicon-containing layer formed at the peripheral portion of the substrate is thinner than that of the polished silicon-containing layer formed at the center portion of the substrate.

<Supplementary Note 3>

In the method of any one of Supplementary notes 1 and 2, preferably, a high frequency power supplied to a second coil disposed at a side of the substrate is greater than a high frequency power supplied to a first coil disposed above the substrate in the step (e) when the data indicates the portion of the polished silicon-containing layer formed at the peripheral portion of the substrate is thinner than that of the polished silicon-containing layer formed at the center portion of the substrate.

<Supplementary Note 4>

In the method of any one of Supplementary notes 1 through 3, preferably, an electric potential applied to the peripheral portion of the substrate is lower than an electric potential applied to the center portion of the substrate in the step (e) when the data indicates the portion of the polished silicon-containing layer formed at the peripheral portion of the substrate is thinner than that of the polished silicon-containing layer formed at the center portion of the substrate.

<Supplementary Note 5>

In the method of Supplementary note 1, preferably, a strength of the magnetic field generated above the substrate is adjusted to be greater than that of the magnetic field generated at a side of the substrate in the step (e) when the data indicates the portion of the polished silicon-containing layer formed at the center portion of the substrate is thinner than that of the polished silicon-containing layer formed at the peripheral portion of the substrate.

<Supplementary Note 6>

In the method of any one of Supplementary notes 1 and 5, preferably, a high frequency power supplied to a first coil disposed above the substrate is greater than a high frequency power supplied to a second coil disposed at a side of the substrate in the step (e) when the data indicates the portion of the polished silicon-containing layer formed at the center portion of the substrate is thinner than that of the polished silicon-containing layer formed at the peripheral portion of the substrate.

<Supplementary Note 7>

In the method of any one of Supplementary notes 1, 5 and 6, preferably, an electric potential applied to the center portion of the substrate is lower than an electric potential applied to the peripheral portion of the substrate in the step (e) when the data indicates the portion of the polished silicon-containing layer formed at the center portion of the substrate is thinner than that of the polished silicon-containing layer formed at the peripheral portion of the substrate.

<Supplementary Note 8>

In the method of any one of Supplementary notes 1 through 7, preferably, the step (d) includes supplying a silicon-containing gas as the process gas, and the step (e) includes compensating for the difference by forming a silicon-containing layer on the polished silicon layer.

<Supplementary Note 9>

In the method of any one of Supplementary notes 1 through 8, preferably, the convex structure is disposed on a portion of the substrate.

<Supplementary Note 10>

According to another aspect of the present disclosure, there is provided a program or a non-transitory computer-readable recording medium storing a program for causing a computer to control a substrate processing apparatus to perform:

(a) receiving data representing a thickness distribution of a polished silicon-containing layer on a substrate including a convex structure whereon the polished silicon-containing layer is formed;

(b) calculating, based on the data, a process data for reducing a difference between a thickness of a portion of the polished silicon-containing layer formed at a center portion of the substrate and that of the polished silicon-containing layer formed at a peripheral portion of the substrate;

(c) loading the substrate into a process chamber;

(d) supplying a process gas to the substrate; and (e) compensating for the difference based on the process data by activating the process gas with a magnetic field having a predetermined strength on the substrate.

<Supplementary Note 11>

According to still another aspect of the present disclosure, there is provided a substrate processing apparatus including:

a receiving unit configured to receive data representing a thickness distribution of a polished silicon-containing layer on a substrate including a convex structure whereon the polished silicon-containing layer is disposed;

a calculating unit configured to calculate, based on the data, a process data for reducing a difference between a thickness of a portion of the polished silicon-containing layer formed at a center portion of the substrate and that of the polished silicon-containing layer formed at a peripheral portion of the substrate;

a process chamber where the substrate is accommodated;

a process gas supply unit configured to supply a process gas into the process chamber;

a magnetic field generator configured to generate a magnetic field having a predetermined strength in the process chamber;

an activation unit configured to activate the process gas; and a control unit configured to control at least one of the receiving unit, the calculating unit, the process gas supply unit, the magnetic field generator and the activation unit to compensate for the difference based on the process data by activating the process gas with the magnetic field.

What is claimed is:

1. A method of manufacturing a semiconductor device, comprising:
   (a) receiving data representing a thickness distribution of a polished silicon-containing layer on a substrate comprising a convex structure whereon the polished silicon-containing layer is formed;
   (b) calculating, based on the data, a process data for reducing a difference between a thickness of a portion of the polished silicon-containing layer formed at a center portion of the substrate and that of the polished silicon-containing layer formed at a peripheral portion of the substrate;
   (c) loading the substrate into a process chamber;
   (d) supplying a process gas to the substrate; and
   (e) compensating for the difference based on the process data by activating the process gas with a magnetic field having a predetermined strength on the substrate.

2. The method of clam 1, wherein a strength of the magnetic field generated at a side of the substrate is adjusted to be greater than that of the magnetic field generated above the substrate in the step (e) when the data indicates the portion of the polished silicon-containing layer formed at the peripheral portion of the substrate is thinner than that of the polished silicon-containing layer formed at the center portion of the substrate.

3. The method of clam 1, wherein a high frequency power supplied to a second coil disposed at a side of the substrate is greater than a high frequency power supplied to a first coil disposed above the substrate in the step (e) when the data indicates the portion of the polished silicon-containing layer formed at the peripheral portion of the substrate is thinner than that of the polished silicon-containing layer formed at the center portion of the substrate.

4. The method of clam 2, wherein a high frequency power supplied to a second coil disposed at a side of the substrate is greater than a high frequency power supplied to a first coil disposed above the substrate in the step (e).

5. The method of clam 1, wherein an electric potential applied to the peripheral portion of the substrate is lower than an electric potential applied to the center portion of the substrate in the step (e) when the data indicates the portion of the polished silicon-containing layer formed at the peripheral portion of the substrate is thinner than that of the polished silicon-containing layer formed at the center portion of the substrate.

6. The method of clam 2, wherein an electric potential applied to the peripheral portion of the substrate is lower than an electric potential applied to the center portion of the substrate in the step (e).

7. The method of clam 3, wherein an electric potential applied to the peripheral portion of the substrate is lower than an electric potential applied to the center portion of the substrate in the step (e).

8. The method of clam 1, wherein a strength of the magnetic field generated above the substrate is adjusted to be greater than that of the magnetic field generated at a side of the substrate in the step (e) when the data indicates the portion of the polished silicon-containing layer formed at the center portion of the substrate is thinner than that of the polished silicon-containing layer formed at the peripheral portion of the substrate.

9. The method of clam 1, wherein a high frequency power supplied to a first coil disposed above the substrate is greater than a high frequency power supplied to a second coil disposed at a side of the substrate in the step (e) when the data indicates the portion of the polished silicon-containing layer formed at the center portion of the substrate is thinner than that of the polished silicon-containing layer formed at the peripheral portion of the substrate.

10. The method of clam 8, wherein a high frequency power supplied to a first coil disposed above the substrate is greater than a high frequency power supplied to a second coil disposed at a side of the substrate in the step (e).

11. The method of clam 1, wherein an electric potential applied to the center portion of the substrate is lower than an electric potential applied to the peripheral portion of the substrate in the step (e) when the data indicates the portion of the polished silicon-containing layer formed at the center portion of the substrate is thinner than that of the polished silicon-containing layer formed at the peripheral portion of the substrate.

12. The method of clam 8, wherein an electric potential applied to the center portion of the substrate is lower than an electric potential applied to the peripheral portion of the substrate in the step (e).

13. The method of clam 1, wherein the step (d) comprises supplying a silicon-containing gas as the process gas, and the step (e) comprises compensating for the difference by forming a silicon-containing layer on the polished silicon layer.

14. The method of clam 8, wherein the step (d) comprises supplying a silicon-containing gas as the process gas, and the step (e) comprises compensating for the difference by forming a silicon-containing layer on the polished silicon layer.

15. The method of clam 1, wherein the convex structure is disposed on a portion of the substrate.

16. The method of clam 8, wherein the convex structure is disposed on a portion of the substrate.

* * * * *